(12) United States Patent
Nakamura et al.

(10) Patent No.: US 6,720,125 B2
(45) Date of Patent: Apr. 13, 2004

(54) IMAGE RECORDING MATERIAL

(75) Inventors: Ippei Nakamura, Shizuoka-ken (JP);
Kazuhiro Fujimaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 115 days.

(21) Appl. No.: 10/177,153

(22) Filed: Jun. 24, 2002

(65) Prior Publication Data

US 2003/0124455 A1 Jul. 3, 2003

(30) Foreign Application Priority Data

Jun. 25, 2001 (JP) .................................. 2001-191655

(51) Int. Cl.$^7$ .............................. F03F 7/021; F03F 7/30
(52) U.S. Cl. .................... 430/157; 430/176; 430/270.1; 430/281.1; 430/302; 430/944; 101/456; 101/465
(58) Field of Search ................................. 430/157, 176, 430/270.1, 281.1, 302, 944; 101/456, 465

(56) References Cited

U.S. PATENT DOCUMENTS

| 5,814,431 A | * | 9/1998 | Nagasaka et al. ........ 430/281.1 |
| 6,326,122 B1 | * | 12/2001 | Nagasaka et al. ........ 430/270.1 |
| 6,537,730 B1 | * | 3/2003 | Fleming et al. .............. 430/302 |
| 6,632,589 B2 | * | 10/2003 | Inno et al. ................... 430/303 |

FOREIGN PATENT DOCUMENTS

| EP | 1096315 A1 | * 5/2001 | ......... G03F/07/029 |
| JP | 7-103171 | 11/1989 | |
| JP | 2001-125260 | 5/2001 | |

* cited by examiner

*Primary Examiner*—John S. Chu
(74) *Attorney, Agent, or Firm*—Sughrue Mion, PLLC

(57) ABSTRACT

The present invention provides an image recording material onto which images can be recorded with an infrared ray, the material comprising an infrared absorbent (A), a radical-generating agent (B) and a radically polymerizable compound (C), wherein the infrared absorbent is a cyanine dye in which at least one substituent on a nitrogen atom in a heterocyclic ring at each end forms a cyclic ring which includes a methine chain.

20 Claims, No Drawings

IMAGE RECORDING MATERIAL

BACKGROUND OF THE INVENTION

1. Field of the Invention

The present invention relates to an image recording material which can be used as a planographic printing plate precursor, a color proof, a photoresist and a color filter. More specifically, the invention relates to a heat mode-usable negative-type image recording material which can be used as a planographic printing plate precursor capable of a so-called direct plate-making, by which a plate can directly be made by scanning with an infrared laser based on digital signals from a computer or the like.

2. Description of the Related Art

Conventionally, as systems for direct plate-making based on digital data from a computer, proposals have included: (1) a system using an electrophotographic method, (2) a system using a photopolymer, which is exposed by a laser emitting blue or green light, (3) a system in which silver salts are deposited on a photosensitive resin, and (4) a system in which silver salts are made to diffuse and transfer.

However, the system using an electrophotographic method (1) involves intricate processes for forming images, such as electrification, exposure, development and the like, and requires a large scale and complicated apparatus. In the system using photopolymerization (2), handling the recording material in a light room is difficult since a plate material exhibiting high sensitivity to blue or green light is used. The systems (3) and (4) use silver salts, therefore, they have the drawbacks that developing is complicated and processing waste liquids include the silver salts.

In recent years, with the remarkable development of laser, high output and portable solid lasers or semiconductor lasers emitting infrared rays, particularly of wavelengths from 760 nm to 1200 nm, are readily available. These lasers are very useful as a recording light source for directly making a plate based on digital data from a computer, or the like. However, using an infrared laser, images cannot be recorded on most types of practically usable photosensitive recording materials since photosensitive wavelengths thereof lie within a visible ray region of 760 nm or less. Therefore, there is a demand for materials on which images can be recorded using an infrared laser.

As this image recording material on which images can be recorded using an infrared laser, a recording material containing an onium salt, a phenol resin and a spectral sensitizer is described in U.S. Pat. No. 4,708,925. This image recording material is a positive-type image recording material which utilizes an effect of inhibiting solubility in a developer using an onium salt and a phenol resin; that is, this recording material is not of a negative-type as disclosed in the present invention. As the negative-type image recording material, a recording material containing an infrared absorbent, an acid generator, a resol resin and a novolak resin is described in U.S. Pat. No. 5,340,699. However, this negative-type image recording material requires heat treatment after laser exposure to form images. Accordingly, there has been a demand for a negative-type image recording material which does not require heat treatment after exposure.

For example, Japanese Patent Application Publication (JP-B) No. 7-103171 describes a recording material which does not require heat treatment after imagewise exposure, and contains a cyanine dye having a specific structure, an iodonium salt and an addition-polymerizable compound having an ethylenically unsaturated double bond. However, when used as a planographic printing plate, this image recording material is low in strength at formed image areas and has a problem in that the number of sheets that can be printed is small.

SUMMARY OF THE INVENTION

It is therefore an object of the present invention to provide a negative-type image recording material onto which images can directly be recorded based on digital data from a computer or the like using a solid laser or a semiconductor laser emitting infrared ray, and which, when used as a planographic printing plate, has high sensitivity, and even under low exposure conditions, has excellent hardening properties at image areas and printing durability.

The inventors conducted extensive research of components constituting the negative-type image recording material, to find that the aforementioned object can be achieved by using, as an infrared absorbent, a cyanine dye having a specific moiety in its molecule, and finally accomplished the present invention.

That is, according to the present invention, there is provided an image recording material onto which images can be recorded by irradiation with an infrared ray, and which contains an infrared absorbent (A), wherein the infrared absorbent (A) is a cyanine dye in which at least one substituent on a nitrogen atom in a heterocyclic ring at each end forms a cyclic ring which includes a methine chain. In a preferred embodiment, the present invention provides a negative-type image recording material which further contains a radical-generating agent (B) represented by onium salts and a radically polymerizable compound (C), in addition to the above-mentioned specific infrared absorbent (A).

Although the functional mechanism of the present invention is not elucidated, the following is hypothesized. When a cyanine dye containing the cyclic ring introduced into at least one of both ends in the molecule is used as the infrared absorbent, a methine chain in the cyanine dye is prevented from being rotated in an excited state while the absorbent is under light exposure. Consequently, thermal deactivation from the excited state, due to molecular movement, decreases and the life span of the excited state is elongated correspondingly, which leads to high sensitivity and sufficient progress of hardening reaction under low exposure conditions. In a photosensitive material system in which a dye is irradiated with a large excess amount of light in heat mode exposure, highly excited state occurs besides ordinal singly excited state, and this state potentially participates in decomposition of a radical-generating agent or the like, whereas because of elongation of the life span of the excited state due to suppressed rotation of a methine chain, the probability of highly excited state to be produced is presumably increased, whereby production of the desired radicals increases, with achieving high sensitivity and rapid progress of polymerizing radically polymerizable compound, thereby leading to formation of a tough recording layer as well as enhancement of printing durability.

Incidentally, "heat mode-usable" in the present invention means that recording by heat-mode exposure is possible. The definition of the heat-mode exposure in the present invention is describe in detail. As stated in Hans-Joachim Timpe, IS & Ts NIP 15:1999 International Conference on Digital Printing Technologies, p.209, there are known two modes in a process starting from photo-excitation of a light absorbing material (for example, dyes) effected in a photosensitive material to a chemical or physical change, in the case where photo-excitation is caused in the material resulting in a chemical or physical change to finally form an image. One is a so-called photon mode in which a photo-excited light absorbing material is deactivated by creating some photochemical interaction (for example, energy transfer or electron transfer) with other reactants in a photosensitive material so that the activated reactants induce a chemical or physical change required for the image-forming. Another is a so-called heat mode in which a photo-excited light absorbing material is deactivated by generating heat and, by utilizing the generated heat, reactants induce a chemical or physical change required for the image-forming. There are known additional specific modes, such as abrasion in which a substance is exploded and scattered by an action of energy of light gathered locally or multi-photon absorption in which one molecule absorbs a large number of photons at a time. However, description of these specific modes is omitted herein.

The exposure processes using the foregoing modes are called photon-mode exposure and heat-mode exposure, respectively. A technical difference between the photon-mode exposure and the heat-mode exposure depends on whether or not an energy amount of some photons for exposure can be added to reach an energy amount of an intended reaction. For example, suppose that a reaction is conducted using n photons. Since the photon-mode exposure utilizes a photochemical interaction, accumulative use of energies of individual photons is impossible according to the law of conservation of energy and momentum of quantum. That is, in order to induce any chemical reaction, a relation defined by "energy amount of 1 photon≧energy amount of reaction" is required. Meanwhile, in the heat-mode exposure, heat is generated after photo-excitation, and light energy is converted into heat and then used. Accordingly, accumulation of the energy amount is possible. Thus, a relation defined by "energy amount of n photons≧energy amount of reaction" is sufficient, with a proviso that there is a limitation to the addition of the energy amount due to the occurrence of the heat diffusion. That is, when the subsequent photo-excitation-deactivating process occurs to generate heat before heat is lost from an exposed area (reaction point) through heat diffusion, heat is surely accumulated and added, which leads to an increase in temperature of the affected portion. However, when the subsequent heat generation is delayed, heat is lost, and not accumulated. That is, in heat-mode exposures with the same total exposure energy amount, the results produced are different between the application of light having a large amount of energy for a short period of time and the application of light having a small amount of energy for a long period of time. The application of light for a short period of time is advantageous for accumulation of heat.

Of course, in the photon-mode exposure, a similar phenomenon sometimes occurs due to diffusion of materials effected in the subsequent reaction. However, such a phenomenon basically does not occur.

That is, in view of characteristics of a photosensitive material, in the photon-mode, an inherent sensitivity (energy amount for a reaction required for image-forming) is fixed to a specified value relative to an exposure power density (w/cm$^2$) (=energy density per unit time). However, in the heat-mode, an inherent sensitivity of a photosensitive material is increased relative to an exposure power density. Accordingly, when an exposure time in which a productivity required for an image recording material can actually be maintained is fixed, high sensitization of approximately 0.1 mJ/cm$^2$ can be attained in the photon-mode exposure when comparing the respective modes with one another. However, no matter how small the amount of exposure is, a reaction may occur. Therefore, a problem of fogging is likely to arise due to low exposure in an unexposed area. On the other hand, in the heat-mode exposure, a reaction does not take place unless an exposure amount is more than a specified value. From the relation to heat stability of a photosensitive material, approximately 50 mJ/cm$^2$ is usually required, but a problem of fogging due to low exposure is avoided.

In fact, in the heat-mode exposure, an exposure power density in a plate surface of a photosensitive material has to be 5,000 w/cm$^2$ or more, preferably 10,000 w/cm$^2$ or more. However, it is not preferred to use a high power density laser of more than $5.0 \times 10^5$ w/cm$^2$ because of a problem that abrasion will occur to taint a light source, which has not been stated in detail here.

DESCRIPTION OF THE PREFERRED EMBODIMENTS

The present invention will be illustrated in detail below.
(A) Cyanine Dye in Which at Least One Substituent on a Nitrogen Atom in a Heterocyclic Ring at Each End Forms a Cyclic Ring Which Includes a Methine Chain, For Use as an Infrared Absorbent In the present invention, a cyanine dye in which at least one substituent on a nitrogen atom present in a heterocyclic ring at each end forms a cyclic ring which includes a methine chain is used as an infrared absorbent.

For the purpose of suppressing rotation of a methine chain in a cyanine dye in an excited state effected by light exposure and heating, it is preferable that the cyclic ring contains, as the constituent element, a nitrogen atom that is present in the heterocyclic ring and the whole methine chain or a part thereof. Specifically, the dyes represented by the following general formulae (1) to (3) are preferable.

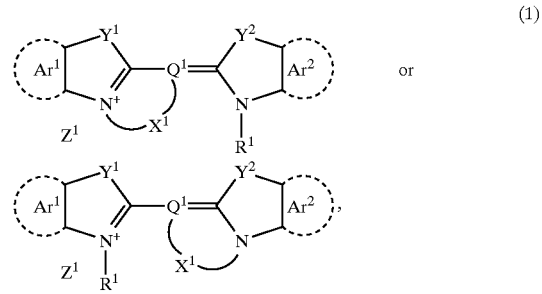

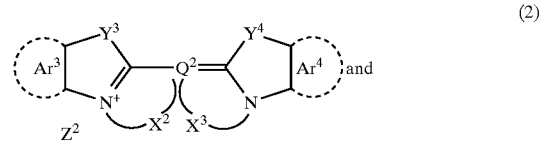

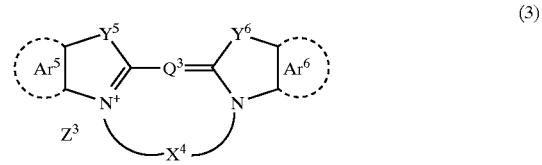

In the above formulae, R$^1$ represents an optionally substituted hydrocarbon group having 20 or less carbon atoms, and preferably represents an alkyl group having 1 to 4 carbon atoms. Ar$^1$ to Ar$^6$ each independently represent an optionally substituted aromatic hydrocarbon group or an optionally substituted heterocyclic group. As the preferable aromatic hydrocarbon group, a benzene ring and a naphthalene ring are mentioned, and as the preferable heterocyclic ring, a pyridine ring, a pyrazine ring and the like are mentioned, among which a benzene ring or a naphthalene ring is particularly preferable. $Y^1$ to $Y^6$ may be the same or different, each represent a sulfur atom, an oxygen atom, a selenium atom, a dialkylmethylene group having 12 or less carbon atoms, a —CH=CH— group or an —NR$^2$— group, among which a dialkylmethylene group such as a dimethylmethylene group or the like is preferable. $R^2$ represents the same substituent as defined for $R^1$.

Q represents a pentamethine group or a heptamethine group, and from the standpoints of suitability for and stability to infrared wavelengths, a heptamethine group is preferable. Q may be substituted by a substituent selected from the group consisting of alkoxy groups, aryloxy groups, alkylthio groups, arylthio groups, dialkylamino groups, diarylamino groups, halogen atoms, alkyl groups, aryl groups, oxy groups and the substituents represented by the following general formula (4), among which diarylamino groups such as a diphenylamino group or the like, and arylthio groups such as a phenylthio group or the like are preferable.

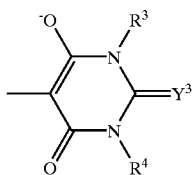

(4)

Further, it is preferable, from the standpoint of stability, that Q has a cyclohexene ring, a cyclopentene ring or a cyclobutene ring containing three continuous methine chains, and a cyclopentene ring or a cyclohexene ring is particularly preferable.

$Z^1$ to $Z^3$ represent a counter ion necessary for neutralizing electric charges. In the case of an anion, such a counter ion may include a halogen ion, a perchlorate ion, a tetrafluoroborate ion, a hexafluorophosphate ion and a sulfonate ion, among which a perchlorate ion and a sulfonate ion are preferable. In the case of a cation, such a counter ion may include organic ions such as an ammonium ion, sulfonium ion and the like, and additionally, alkali metal ions or alkaline earth metal ions such as a sodium ion, a potassium ion, a calcium ion and the like.

$X^1$ to $X^4$ each independently represent a divalent organic group necessary for forming a cyclic ring, preferably represents an alkylene group having 2 or more carbon atoms, and each methylene group in the alkylene group may be substituted with a divalent organic group such as an oxygen atom, a sulfur atom, an —NH— group, a phenylene group or the like, and the phenylene group may carry a monovalent substituent such as an alkyl group, an alkoxy group, a halogen atom, a carboxyl group or the like.

As the infrared absorbent, heptamethinecyanine dyes having an indolenine skeleton, a benzindolenine skeleton, a benzothiazole skeleton, a benzoxazole skeleton or a benzselenazole skeleton are particularly preferable from the standpoints of image forming property and absorption wavelength suitability, and heptamethinecyanine dyes having an indolenine skeleton or a benzindolenine skeleton are most preferable.

Among the dyes having the above-mentioned cyclic ring, the dye represented by the following general formula (5) or (6) is mentioned as more preferable examples.

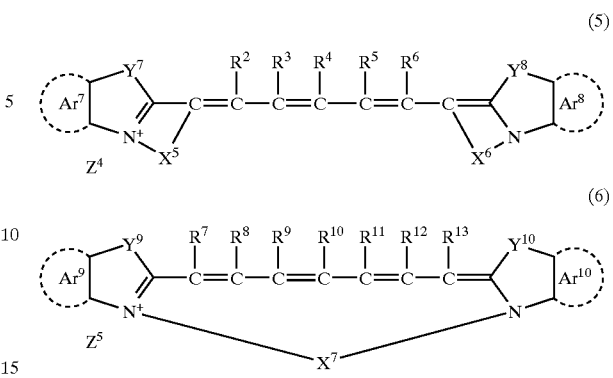

In the above formula (5) or (6), $Ar^7$ to $Ar^{10}$, $Y^7$ to $Y^{10}$ and $Z^4$ to $Z^5$ have the same meanings as defined for $Ar^1$ to $Ar^6$, $Y^1$ to $Y^6$ and $Z^1$ to $Z^3$, respectively, and may be the same or different. $R^2$ to $R^{13}$ each independently represent a hydrogen atom or a substituent selected from the group consisting of alkoxy groups, aryloxy groups, alkylthio groups, arylthio groups, dialkylamino groups, diarylamino groups, halogen atoms, alkyl groups, aryl groups, oxy groups and the substituent represented by the above-shown general formula (4), and it is preferable in view of stability that adjacent two substituents are bonded to each other to form a 5-membered or 6-membered ring.

Regarding $R^2$ to $R^{13}$, $R^4$ and $R^{10}$ preferably represent a substituent other than a hydrogen atom, and preferable examples of the substituent include aryloxy groups such as a phenoxy group and the like, arylthio groups such as a phenylthio group and the like, diarylamino groups such as a diphenylamino group and the like, and halogen atoms such as a chlorine atom and the like. From the standpoint of image forming property, arylthio groups such as a phenylthio group and the like and diarylamino groups such as a diphenylamino group and the like are particularly preferable.

$X^5$ to $X^7$ each independently represent a divalent organic group necessary for forming a cyclic ring, preferably represents an alkylene group having 2 or more carbon atoms, and each methylene group in the alkylene group may be substituted with a divalent organic group such as an oxygen atom, a sulfur atom, an —NH— group, a phenylene group or the like, and the phenylene group may carry a monovalent substituent such as an alkyl group, an alkoxy group, a halogen atom, a carboxyl group or the like. $X^5$ and $X^6$ preferably represent an alkylene group having 2 to 3 carbon atoms, and an ethylene group or a propylene group is particularly preferable. $X^7$ preferably represents an alkylene group having 4 to 10 carbon atoms, and as the divalent connecting group in which each methylene group in the alkylene group is substituted with a divalent organic group such as an oxygen atom, a sulfur atom, an —NH— group, a (substituted) phenylene group or the like, the following groups are listed.

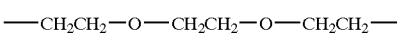

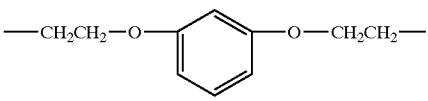

-continued

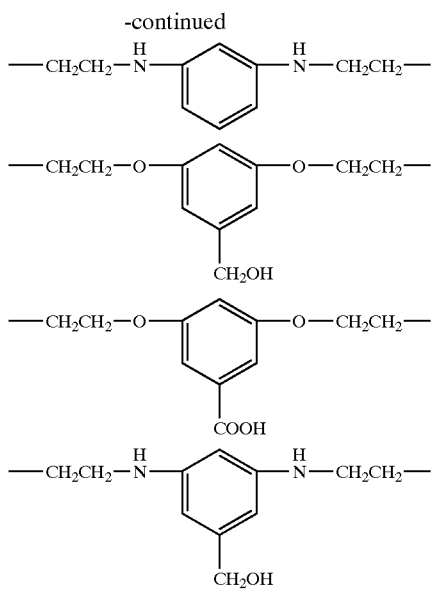

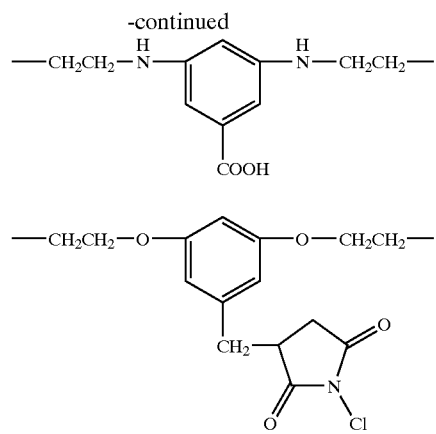

Specific examples of the infrared absorbent which can be suitably used in the present invention are listed in the following Tables 1 to 9, representing the skeleton of the chromophore and substituents thereon, however, the present invention is not limited thereto.

TABLE 1

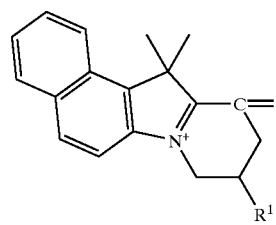

|  | $R^1$ | $Z^-$ |
|---|---|---|
| IR-1 | H | $ClO_4^-$ |
| IR-2 | H | $CF_3SO_3^-$ |
| IR-3 | H | $I^-$ |
| IR-4 | $CH_3$ | $ClO_4^-$ |
| IR-5 | $CH_3$ | $CF_3SO_3^-$ |
| IR-6 | $OC_2H_5$ | $I^-$ |

TABLE 2

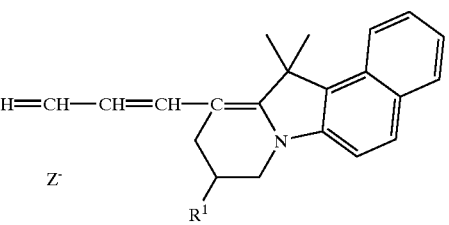

|  | $R^2$ | $Z^-$ |
|---|---|---|
| IR-7 | H | $BF_4^-$ |
| IR-8 | H | $ClO_4^-$ |
| IR-9 | Cl | $ClO_4^-$ |
| IR-10 | Cl | $CF_3SO_3^-$ |
| IR-11 | $SO_2CH_3$ | $I^-$ |
| IR-12 | $SO_2CH_3$ | $ClO_4^-$ |

TABLE 3

| | R³ | Z⁻ |
|---|---|---|
| IR-13 | H | $ClO_4^-$ |
| IR-14 | Cl | $ClO_4^-$ |

TABLE 4

| | n | Z⁻ |
|---|---|---|
| IR-15 | 2 | $CH_3$-C₆H₄-$SO_3^-$ |
| IR-16 | 3 | $ClO_4^-$ |

TABLE 5

| | R⁴ | Y¹ | Z⁻ |
|---|---|---|---|
| IR-17 | $CH_3$ | $-C(CH_3)_2-$ | $ClO_4^-$ |
| IR-18 | $(CH_2)_3SO_3^-$ | $-S-$ | — |

TABLE 6

| | n | Z⁻ |
|---|---|---|
| IR-19 | 2 | $CH_3$-C₆H₄-$SO_3^-$ |
| IR-20 | 3 | $ClO_4^-$ |

TABLE 7
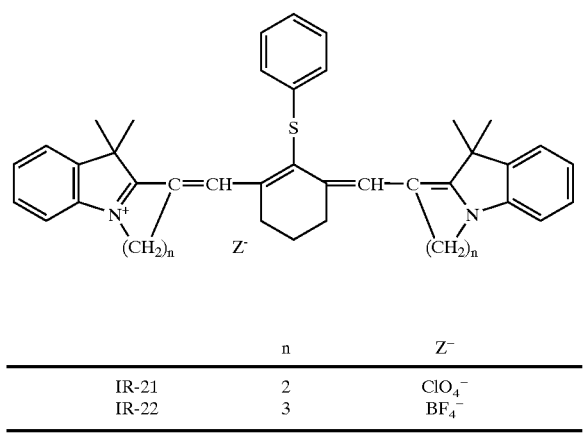
|       | n | Z⁻    |
|-------|---|-------|
| IR-21 | 2 | $ClO_4^-$ |
| IR-22 | 3 | $BF_4^-$  |
TABLE 8
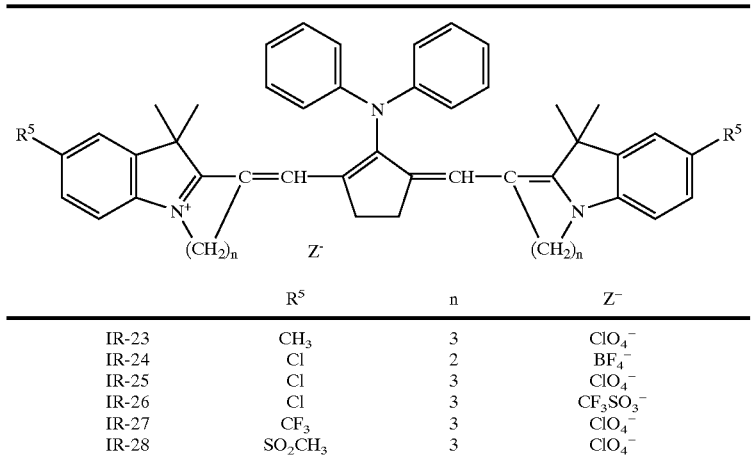
|       | R⁵       | n | Z⁻         |
|-------|----------|---|------------|
| IR-23 | $CH_3$   | 3 | $ClO_4^-$  |
| IR-24 | Cl       | 2 | $BF_4^-$   |
| IR-25 | Cl       | 3 | $ClO_4^-$  |
| IR-26 | Cl       | 3 | $CF_3SO_3^-$ |
| IR-27 | $CF_3$   | 3 | $ClO_4^-$  |
| IR-28 | $SO_2CH_3$ | 3 | $ClO_4^-$ |
TABLE 9
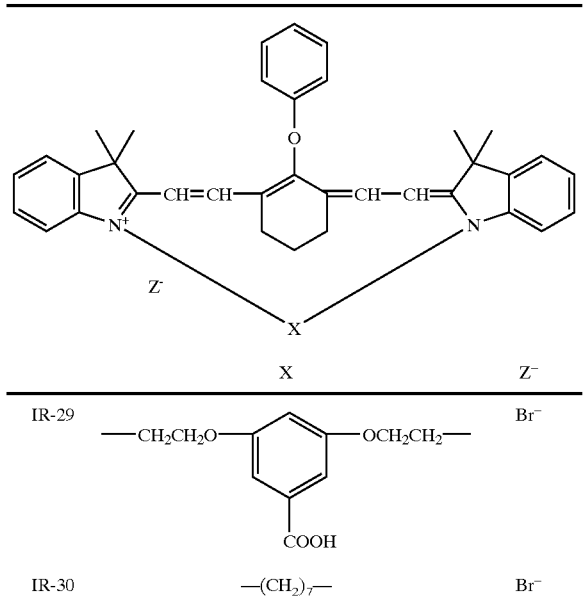
|       | X | Z⁻ |
|-------|---|----|
| IR-29 | —CH₂CH₂O—⌬(COOH)—OCH₂CH₂— | Br⁻ |
| IR-30 | $-(CH_2)_7-$ | Br⁻ |
TABLE 9-continued
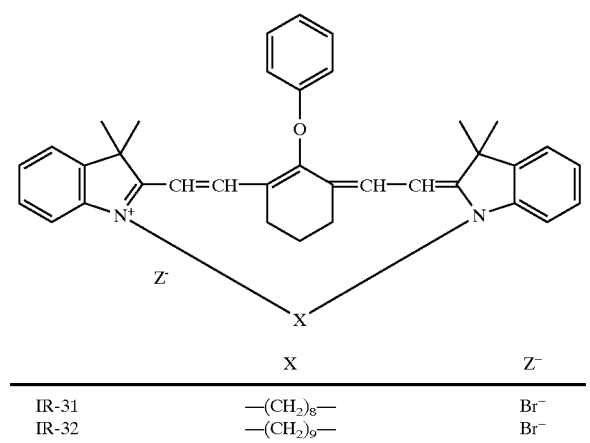
|       | X | Z⁻ |
|-------|---|----|
| IR-31 | $-(CH_2)_8-$ | Br⁻ |
| IR-32 | $-(CH_2)_9-$ | Br⁻ |
TABLE 9-continued
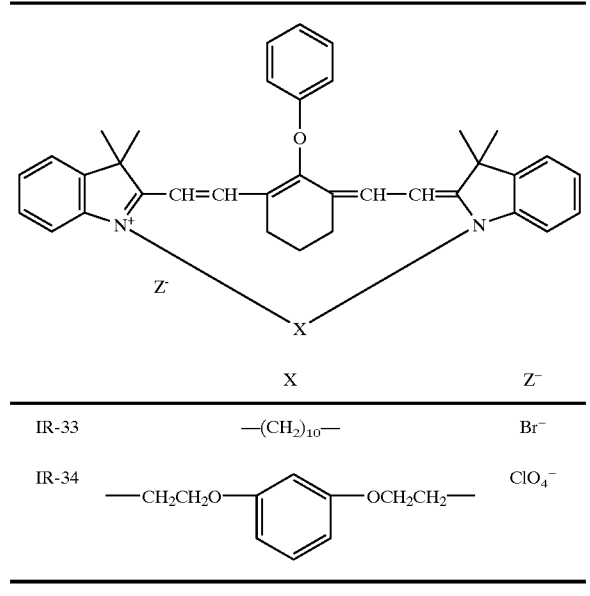
|       | X | Z⁻ |
|-------|---|----|
| IR-33 | $-(CH_2)_{10}-$ | Br⁻ |
| IR-34 | —CH₂CH₂O—⌬—OCH₂CH₂— | $ClO_4^-$ |

These infrared absorbents can be produced by known organic synthesis techniques. Specifically, these infrared absorbents can be synthesized by synthesis methods described in Sov. Prog. Chem., vol. 41, no. 11, pp. 42 to 46 (1975), Ukr. Khim. Zh., vol. 41, no. 11, pp. 1165 to 1170 (1975), Ukr. Khim. Zh., vol. 55, no. 3, pp. 290 to 294 (1986), U.S. Pat. No. 3,408,195, EP No. 670,374 A1, U.S. Pat. No. 5,571,388 and the like.

The above-mentioned infrared absorbents may be used singly or in combination of two or more.

The above-mentioned infrared absorbents can be added to an image recording material in an amount of 0.01 to 50% by weight, preferably 0.1 to 20% by weight, particularly preferably 1 to 10% by weight based on the total solid content of the image recording material. When the addition amount is less than 0.01% by weight, sensitivity lowers, and when over 50% by weight, stains occur at non-image areas in printing.

Conventional infrared absorbents can also be used simultaneously in a range not impairing the effect of the present invention, however in this case, the content of the conventional infrared absorbent used is preferably 40% by weight or less based on the total solid content of the infrared absorbents used.

As the infrared absorbent which can simultaneously be used, any substance which absorbs energy of irradiated light used for recording and then generates heat can be used without restricting an absorption wavelength range. From the standpoint of applicability to a readily available high output laser, infrared absorbing dyes or pigments having an absorption maximum in the wavelength range from 760 nm to 1200 nm are preferably mentioned, and for example, dyes and pigments described in Japanese Patent Application Laid-Open (JP-A) Nos. 7-285275 and 10-268512 and the like are mentioned.

When a recording material is produced by using these infrared absorbents, the optical density at the absorption maximum in the infrared range is preferably from 0.05 to 3.0. Outside this range, sensitivity tends to lower. Since optical density is determined by the addition amount of the infrared absorbents used and the thickness of a recording layer, a predetermined optical density is obtained by controlling both conditions. The optical density of a recording layer can be measured by an ordinary method. As the measuring method, there are mentioned, for example, a method in which a recording layer having a thickness specified within a suitable range for use as a planographic printing plate in terms of a coating amount after drying is formed on a transparent or white substrate, followed by determination of the optical density by an optical densitometer of transmission type, a method in which a recording layer is formed on a reflective substrate such as aluminum or the like, followed by determination of the reflective density, and the like methods.

These infrared absorbents may be included in a layer that also contains other components, or alternatively, an additional layer may be provided to contain the infrared absorbent.

(B) Radical-generating Agent

The term radical-generating agent refers to a compound which generates radicals by application of light or heat, or both energies, to thereby initiate and promote polymerization of a compound having a polymerizable unsaturated group. Suitable radical-generating agents for use in the present invention can be selected and used from conventionally known heat polymerization initiators and compounds having a bond whose binding and dissociating energy are small. Preferable examples of the radical-generating agent include onium salts, triazine compounds having a trihalomethyl group, peroxides, azo-based polymerization initiators, azide compounds, quinonediazide compounds, metallocene compounds and organic borate compounds, among which onium salts described below are preferable in view of high sensitivity.

Examples of the onium salt for suitably use as a radical-generating agent in the present invention include diazonium salts, iodonium salts, sulfonium salts, ammonium salts and pyridinium salts, among which iodonium salts, diazonium salts and sulfonium salts are preferabe. In the present invention, these onium salts act not as an acid generator but as an ionic radical polymerization initiator. Examples of the onium salt for suitably use in the present invention include the onium salts represented by the following general formulae (III) to (V).

 General formula (III)

 General formula (IV)

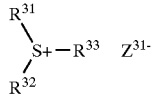 General formula (V)

In the formula (III), $Ar^{11}$ and $Ar^{12}$ each independently represent an optionally substituted aryl group having 20 or less carbon atoms. When this aryl group has substituents, preferable examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from the group consisting of a halogen ion, a perchlorate ion, a tetrafluoroborate ion, a hexafluorophosphate ion, a carboxylate ion and a sulfonate ion, among which a perchlorate ion, a hexafluorophosphate ion, a carboxylate ion and an arylsulfonate ion are preferable.

In the formula (IV), $Ar^{21}$ represents an substituted aryl group having 20 or less carbon atoms. As the preferable substituent, a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms are listed. $Z^{21-}$ represents the same counter ion as defined for $Z^{11-}$.

In the formula (V), $R^{31}$, $R^{32}$ and $R^{33}$ may be the same or different, each represent an optionally substituted hydrocarbon group having 20 or less carbon atoms. Preferable examples of the substituent include a halogen atom, a nitro group, an alkyl group having 12 or less carbon atoms, an alkoxy group having 12 or less carbon atoms and an aryloxy groups having 12 or less carbon atoms. $Z^{31-}$ represents the same counter ion as defined for $Z^{11-}$.

Specific examples of onium salts represented by the general formula (III) ([OI-1] to [OI-10]), onium salts represented by the general formula (IV) ([ON-1] to [ON-5]) and onium salts represented by the general formula (V) ([OS-1] to [OS-7]), for suitably use in the present invention, are listed below.

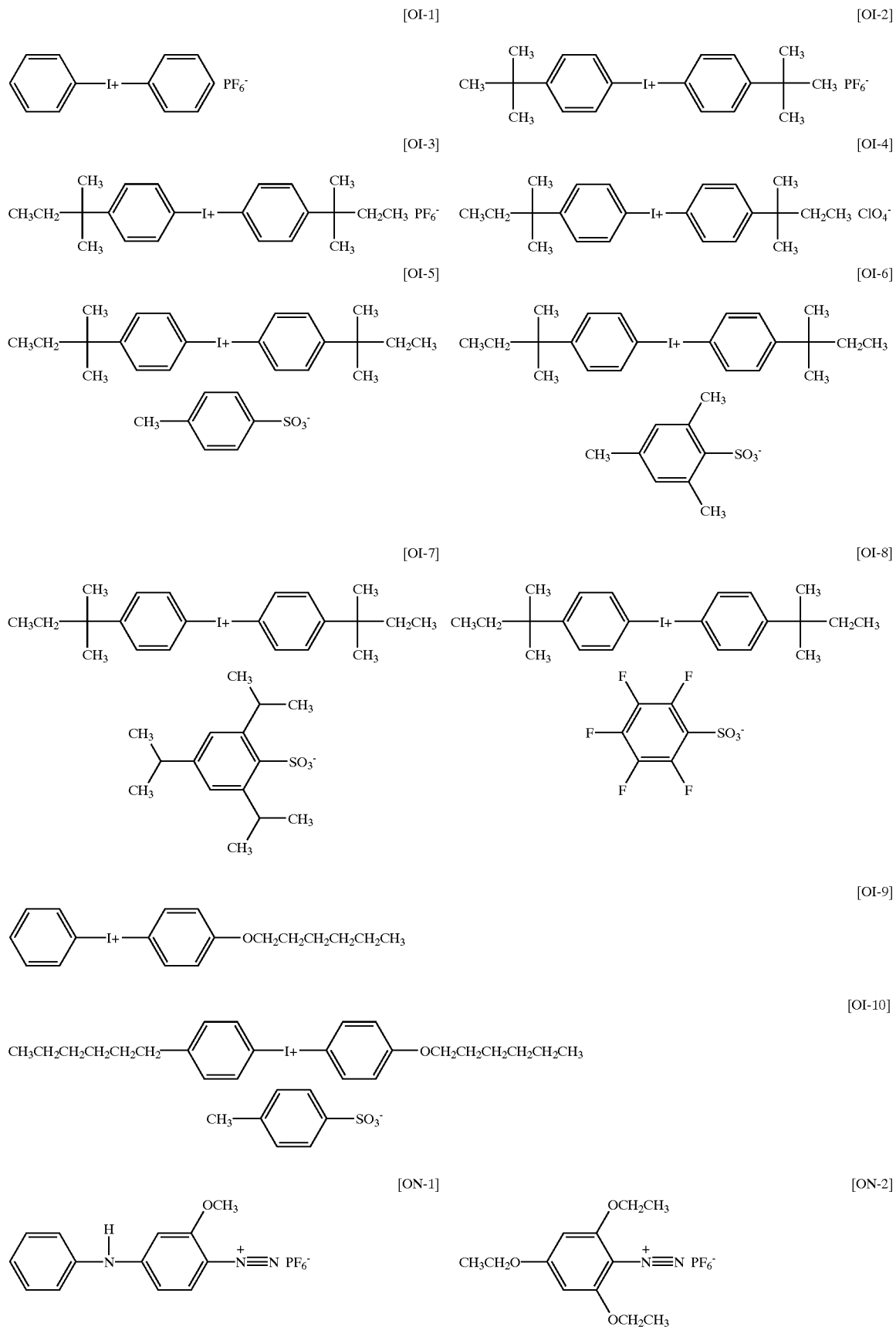

-continued
[ON-3]
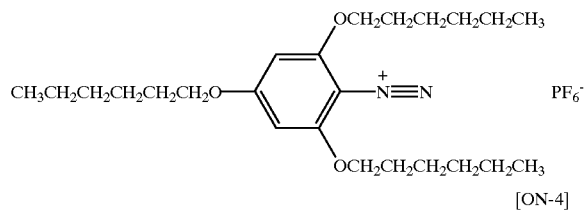
[ON-4]
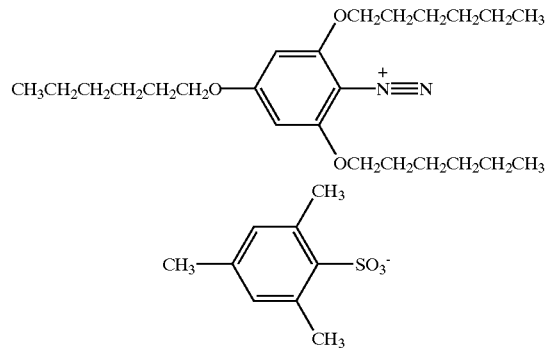
[ON-5]
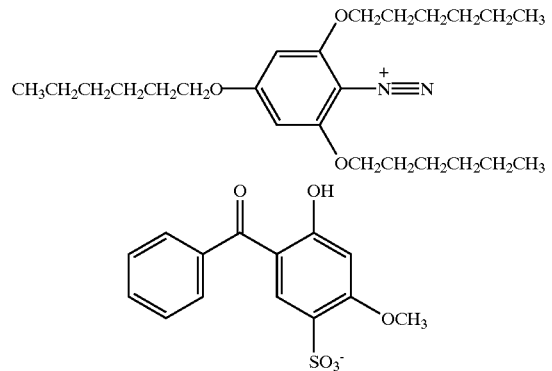
[OS-1]
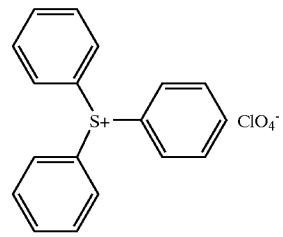
[OS-2]
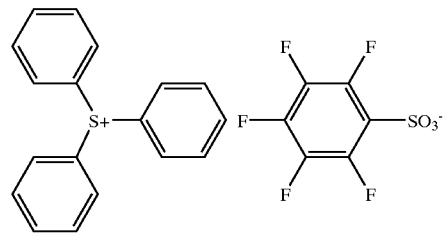
[OS-3]
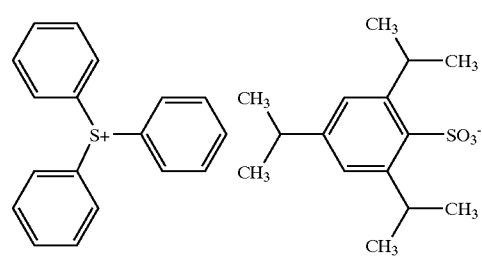
[OS-4]
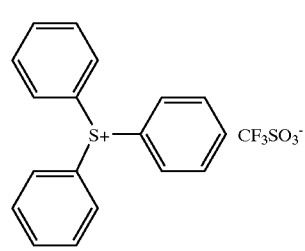
[OS-5]
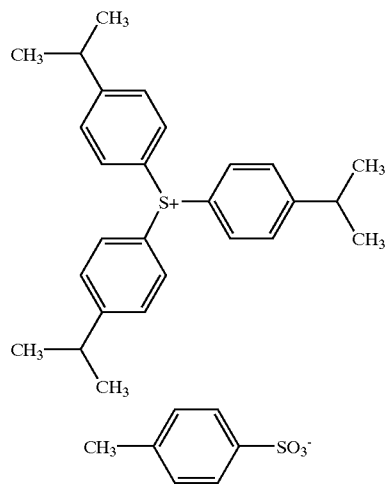
[OS-6]
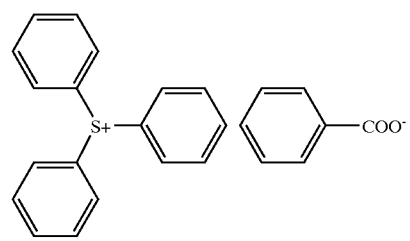

-continued

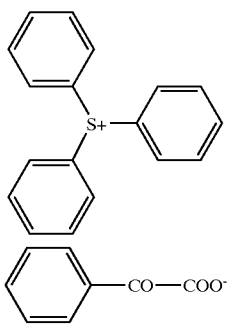

[OS-7]

The radical-generating agent for use in the present invention has a maximum absorption at a wavelength preferably of 400 nm or less, more preferably of 360 nm or less. By specifying the absorption wavelength within an ultraviolet region, image recording materials can be handled under white light.

These radical-generating agents can be added to an image recording material in an amount of 0.1 to 50% by weight, preferably 0.5 to 30% by weight, particularly preferably 1 to 20% by weight based on the total solid content of the image recording material. When the addition amount is less than 0.1% by weight, sensitivity lowers, while when over 50% by weight, stains occur at non-image areas in printing. These radical-generating agents may be used singly or in combination of two or more. These radical-generating agents may be included in a layer that also contains other components, or alternatively, another layer may be provided to contain the radical-generating agent.

(C) Radically Polymerizable Compound

The radically polymerizable compound for use in the invention is a radically polymerizable compound having at least one ethylenically unsaturated double bond, and is selected from compounds having at least one, preferable two terminal ethylenically unsaturated bonds. Such compounds are widely known in this industrial field, and can be used in the invention without imposing any specific restriction. These compounds have chemical forms such as, for example, a monomer and prepolymers, namely, a dimer, trimer and oligomer, or the mixture thereof and the copolymer thereof and the like. As examples of the monomer and the copolymer thereof, unsaturated carboxylic acids (for example, acrylic acid, methacrylic acid, itaconic acid, crotonic acid, isocrotonic acid, maleic acid and the like), the esters and the amides thereof are listed, and preferably, esters of unsaturated carboxylic acids with aliphatic polyhydric alcohol compounds, and amides of unsaturated carboxylic acids with aliphatic polyhydric amine compounds are used. Further, adducts of unsaturated carboxylates or carboxylic amides having a nucleophilic substituent such as a hydroxyl group, amino group, mercapto group and the like with mono-functional or poly-functional isocyanates or epoxies, dehydrated condensates thereof with monofunctional or poly-functional carboxylic acids, and the like are also suitably used. Furthermore, adducts of unsaturated carboxylates or carboxylic amides having an electrophilic substituent such as an isocyanate group, epoxy group and the like with mono-functional or poly-functional alcohols, amines or thiols, and substitution reaction products of unsaturated carboxylates or carboxylic amides having a leaving substituent such as a halogen group, tosyloxy group and the like with mono-functional or poly-functional alcohols, amines or thiols, are also suitable. As other examples, compounds obtained by substituting the above-mentioned unsaturated carboxylic acids with an unsaturated phosphonic acid, styrene and the like can also be used.

Specific examples of acrylate, which is an ester of an aliphatic polyvalent alcohol compound with an unsaturated carboxylic acid, for use as the radically polymerizable compound include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer.

Specific examples of methacrylate include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis-[p-(methacryloxyethoxy)phenyl]dimethylmethane.

Examples of itaconate include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of crotonate include ethylene glycol dicrotonate, tetramethylene glycol dicrotonate, pentaerythritol dicrotonate and sorbitol tetradicrotonate.

Examples of isocrotonate include ethylene glycol diisocrotonate, pentaerythritol diisocrotonate and sorbitol tetraisocrotonate.

Examples of maleate include ethylene glycol dimaleate, triethylene glycol dimaleate, pentaerythritol dimaleate and sorbitol tetramaleate.

As other esters, for example, aliphatic alcohol-based esters described in JP-B Nos. 46-27926 and 51-47334, and JP-A No. 57-196231, esters having an aromatic skeleton described in JP-A Nos. 59-5240, 59-5241 and 2-226149, esters containing an amino group described in JP-A No. 1-165613, and the like are suitably used.

Specific examples of monomers of the amide of an aliphatic polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine trisacrylamide, xylylenebisacrylamide and xylylenebismethacrylamide.

As other preferable examples of amide-based monomers, those having a cyclohexylene structure described in JP-B No. 54-21726 are mentioned.

Urethane-based addition-polymerizable compounds produced by an addition reaction of an isocyanate with a hydroxyl group are also suitable. Specific examples thereof include a vinylurethane compound containing in one molecule two or more polymerizable vinyl groups, which is obtained by adding a vinyl monomer containing a hydroxyl group represented by the following formula (VI) to a polyisocyanate compound having in one molecule two or more isocyanate groups described in JP-B No. 48-41708, and other compounds.

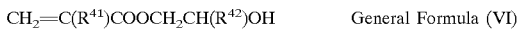

$$CH_2=C(R^{41})COOCH_2CH(R^{42})OH \qquad \text{General Formula (VI)}$$

wherein $R^{41}$ and $R^{42}$ represent H or $CH_3$.

Further, urethane acrylates as described in JP-A No. 51-37193, and JP-B Nos. 2-32293 and 2-16765, and urethane compounds having an ethylene oxide skeleton described in JP-B Nos. 58-49860, 56-17654, 62-39417 and 62-39418 are also suitable.

Moreover, radically polymerizable compounds having an amino structure or sulfide structure in the molecule, described in JP-A Nos. 63-277653, 63-260909 and 1-105238 may also be used.

As additional examples of the radically polymerizable compound, polyfunctional acrylates and methacrylates such as polyester acrylates, epoxy acrylates obtained by reacting an epoxy resin with (meth)acrylic acid are mentioned as described in JP-A No. 48-64183 and JP-B Nos. 49-43191 and 52-30490. Specific unsaturated compounds described in JP-B Nos. 46-43946, 1-40337 and 1-40336, vinylphosphonic acid-based compounds described in JP-A No. 2-25493, and the like are also mentioned. In some cases, the compounds having the structure containing a perfluoroalkyl group as described in JP-A No. 61-22048 are suitably used. Further, those presented as photo-curable monomers and oligomers in the *Journal of the Society of Adhesive of Japan*, vol. 20, No. 7, pp. 300 to 308 (1984) can also be used.

Details of using these radically polymerizable compounds such as structures, single use or combined use and the respective addition amount can arbitrarily be selected depending on the performance or the design of the final product of the recording material. For example, the details are selected from the following standpoints. From the standpoint of sensitivity, the compounds having the structure containing a larger number of unsaturated groups per molecule are preferable, and in may cases, the compounds having the structure containing 2-or more functional groups are preferable. For enhancing strength at image areas, i.e., a cured film, the compounds having the structure containing 3- or more functional groups are advantageous. Further, both photosensitivity and strength can effectively be controlled by use of a combination of the compounds having different number of functional groups or the compounds having different number of polymerizable groups (for example, acrylate-based compounds, methacrylate-based compounds, styrene-based compounds and the like). Compounds having a larger molecular weight and compounds having higher hydrophobicity are excellent in sensitivity and film strength, however, they are sometimes not preferable in view of development speed and deposition in a developer. Also in view of dispersibility and compatibility with other components in a photosensitive layer (for example, a binder polymer, an initiator, a coloring agent and the like), it is a significant factor to select and use a suitable radically polymerizable compound. For example, compatibility can be improved in some cases by use of compounds having low purity or use of two or more compounds in combination. Further, for the purpose of improving adhesiveness of a substrate, overcoat layer and the like, the compound having a specific structure may be adopted. It is advantageous, from the standpoint of sensitivity, that a radically polymerizable compound is included in an image recording layer in a higher ratio. However, if included in too high a ratio, problems may arise, such as undesirable phase separation, failures in a production process due to stickiness of an image recording layer (for example, transfer of recording layer components, production failure resulting from sticky adhesion), deposition from a developer, and the like. From these standpoints, a preferable ratio of a radically polymerizable compound included in the image recording layer is, in many cases, from 5 to 80% by weight, preferably from 20 to 75% by weight based on the total weight of all components in the composition. The radically polymerizable compounds may be used singly or in combination of two or more. Additionally, a suitable structure, an incorporating ratio and an addition amount of the radically polymerizable compound can arbitrarily be selected from the standpoints of degree of polymerization hindrance by oxygen, resolution, fogging property, a change in refractive index, surface stickiness and the like. In some cases, a layer construction is considered and application of coating such as a topcoat and an undercoat can be carried out.

(D) Binder Polymer

The image recording material of the invention may further contain a binder polymer, as necessary, in order to improve film properties of a recording layer to be formed. As the binder, a linear organic polymer is preferably used. As such a "linear organic polymer", conventionally known polymers may arbitrarily be used. In order to carry out development with water or development with a weak aqueous alkaline solution, liner organic polymers, which are soluble in or swellable with water or a weak aqueous alkaline solution, are preferably chosen. The linear organic polymers are selected for use, not only as a film forming agent for an image recording material but also depending on applications for development with water or development with a weak aqueous alkaline solution or an organic solvent. For example, when a water-soluble organic polymer is used, development with water is possible. As such a linear organic polymer, radical polymers having a carboxyl group as a side chain, for example, as described in JP-A No. 59-44615, JP-B Nos. 54-34327, 58-12577 and 54-25957, JP-A Nos. 54-92723, 59-53836 and 59-71048, i.e., methacrylic acid copolymers, acrylic acid copolymers, itaconic acid copolymers, crotonic acid copolymers, maleic acid copolymers, partially esterified maleic acid copolymers and the like are mentioned. Further, acidic cellulose derivatives having a carboxyl group as a side chain are mentioned. In addition, those obtained by adding a cyclic acid anhydride to a polymer having a hydroxyl group, and the like are useful.

Among the above-mentioned compounds, (meth)acrylic resins having a benzyl group or an allyl group, and a carboxyl group as a side chain, and alkali-soluble resins having a double bond in a side chain described in JP-A No. 2000-187322 are excellent in balance of film strength, sensitivity and development property and thus suitable for use.

Urethane-based binder polymers containing an acid group described in JP-B Nos. 7-12004, 7-120041, 7-120042 and 8-12424, JP-A Nos. 63-287944, 63-287947, 1-271741 and 10-116232 are advantageous in view of strength, printing durability and low exposure suitability.

As additional water-soluble linear organic polymers, polyvinylpyrrolidone, polyethylene oxide and the like are useful. For enhancing strength of a cured film, alcohol-soluble nylon, and a polyether of 2,2-bis-(4-hydroxyphenyl)-propane with epichlorohydrin, and the like are also useful.

The weight-average molecular weight of a polymer for use in the invention is preferably 5000 or more, further preferably is from 10,000 to 300,000, and the number-average molecular weight is preferably 1,000 or more, further preferably is from 2,000 to 250,000. The degree of polydispersion (weight-average molecular weight/number-average molecular weight) is preferably 1 or more, further preferably from 1.1 to 10.

These polymers may be any of random polymers, block polymers, graft polymers and the like, and random polymers are preferable.

The polymers for use in the invention can be synthesized by a conventionally known method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents are used alone or in admixture of two or more.

As the radical polymerization initiator usable in synthesizing the polymer for use in the invention, known compounds such as azo-based initiators, peroxide initiators and the like can be used.

The binder polymer for use in the invention may be used singly or in combination thereof. When these polymers are added, the addition amount is 20 to 95% by weight, preferably 30 to 90% by weight based on the total solid content of the image recording material. When the addition amount is less than 20% by weight, an effect of improving strength at image areas is not sufficiently obtained after image formation. When the addition amount is over 95% by weight, an image is not formed. A mixing ratio of the compound having an ethylenically unsaturated double bond capable of undergoing radical polymerization to the linear organic polymer is preferably from 1/9 to 7/3 by weight.

Other Components

In the present invention, various compounds other than the above-mentioned compounds may further be incorporated, as necessary, in the image recording material. For example, dyes exhibiting high light absorption in the visible wavelength region can be used as a coloring agent for images. Specifically, Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes described in JP-A No. 62-293247 are listed. Further, pigments such as phthalocyanine-based pigments, azo-based pigments, carbon black, titanium oxide and the like can also be used suitably.

It is preferable to incorporate these coloring agents in the image recording material since discrimination is readily made between image areas and non-image areas after image formation. The addition amount of the coloring agent is from 0.01 to 10% by weight based on the total solid content of the an image recording material.

In the present invention, it is preferable to incorporate a small amount of heat polymerization inhibitor when producing or storing an image recording material so that unnecessary heat polymerization of the compound having a radically polymerizable ethylenically unsaturated double bond can be hindered. Suitable examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The addition amount of the heat polymerization inhibitor is preferably about 0.01% to about 5% by weight based on the total weight of the composition. If necessary, higher fatty acids and the derivative thereof such as behenic acid and behenic amide may be incorporated so that the compound would locally exist on the surface of a photosensitive layer in the process of drying after coating in order to inhibit polymerization hindrance by oxygen. The addition amount of the higher fatty acid derivative is preferably from about 0.1% to about 10% by weight based on the total weight of the composition.

To an image recording material of the present invention, there may be added nonionic surfactants as described in JP-A Nos. 62-251740 and 3-208514 and amphoteric surfactants as described in JP-A Nos. 59-121044 and 4-13149 in order to enhance processing stability under developing conditions.

Specific examples of the nonionic surfactant include sorbitan tristearate, sorbitan monopalmitate, sorbitan triolate, stearic monoglyceride and polyoxyethylene nonyl phenyl ether.

Illustrative examples of the amphoteric surfactant include alkyldi(aminoethyl)glycine, alkylpolyamino-ethylglycine hydrochloride, 2-alkyl-N-carboxyethyl-N-hydroxyethylimidazolinium betaine and N-tetradecyl-N,N-betaine type surfactant (for example, AMOGEN K, manufactured by Dai-ichi Kogyo Seiyaku Co., Ltd.).

The amount of the above-listed nonionic surfactants and amphoteric surfactants included in the image recording material is preferably from 0.05 to 15% by weight, more preferably from 0.1 to 5% by weight.

Further, a plasticizer may be included, as necessary, in the image recording material of the present invention for imparting flexibility to a film. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate are used.

In the image recording material of the present invention, the above-mentioned components are usually dissolved in a solvent and then applied onto a suitable substrate. Examples of the solvent used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water. These solvents are used alone or in admixture. The concentration of the above-mentioned components (all solid components including additives) is preferably from 1 to 50% by weight.

The coating amount (solid content) onto a substrate after dried varies depending on the use thereof. In case where the material is used as a planographic printing plate precursor, a preferable coating amount is usually from 0.5 to 5.0 g/m². With a decreasing coating amount employed, apparent sensitivity increases, but impairing the film properties of the image recorded film.

As the coating method, various methods can be used including, for example, bar coating, rotational coating, spray coating, curtain coating, dip coating, air knife coating, blade coating and roll coating.

To the image recording material of the present invention, there may be added surfactants such as fluorine-based surfactants as described in JP-A No. 62-170950 in order to improve coatabilty. The addition amount of the surfactant is preferably from 0.01 to 1% by weight, more preferably from 0.05 to 0.5% by weight.

Intermediate Resin Layer

In the image recording material of the present invention, an intermediate resin layer can be provided between a substrate and a recording layer containing a photo-polymerizable compound, as necessary.

By providing this intermediate resin layer, advantages are provided in that a recording layer containing a photo-polymerizable compound, which is a layer sensitive to infrared ray and shows decrease in solubility into an alkali developer by exposure, is provided on the exposure surface or its vicinity, to thereby produce good sensitivity to an infrared laser, and that the existence of an intermediate resin layer made of a polymer between a substrate and a layer sensitive to an infrared ray functions as a heat insulation layer, to thereby prevent diffusion of heat generated by exposure to an infrared laser and thus utilizes heat efficiently, leading to high sensitivity. Further, it is supposed that, in the exposed part, a photosensitive layer sensitive to infrared ray which has been changed to non-permeable to an alkali developer functions as a protective layer for an intermediate resin layer, developing stability becomes excellent and an image excellent in discrimination is formed and stability by time is also secured, while in the non-exposed part, non-hardened binder components are quickly dissolved and dispersed in a developer. In addition, since an intermediate resin layer present adjacent to a substrate is composed of an alkali-soluble polymer, solubility in a developer is excellent, and for example, even if a developer having decreased activity is used, a residual film is not formed and quickly dissolved, to provide excellent developing property, revealing that this intermediate resin layer is useful.

Protective Layer

In the image recording material of the present invention, a protective layer can be provided, as necessary, on a recording layer containing a photo-polymerizable compound. Such an image recording material is usually exposed to light under atmospheric condition, and the protective layer prevents contamination of a lower molecular weight compound such as oxygen and basic substances existing in the air, to thereby inhibit an image forming reaction occurring by exposure in the photosensitive layer and to prevent inhibition of an image forming reaction by exposure in the air. Therefore, the property required of such a protective layer is low permeability of a lower molecular weight compound such as oxygen, and further the protective layer is required to exhibit excellent transmissivity of light used for exposure, have excellent adhesion to a photosensitive layer and have good removability in a developing process after exposure.

Such contrivances regarding the protective layer have conventionally been made and described in detail in U.S. Pat. No. 3,458,311 and JP-A No. 55-49729. As the material which can be used in the protective layer, for example, water-soluble higher molecular weight compounds relatively excellent in crystallinity may be advantageously used. Specifically, water-soluble polymers such as polyvinyl alcohol, polyvinylpyrrolidone, acidic celluloses, gelatin, gum arabic, polyacrylic acid and the like are known, among which polyvinyl alcohol is mainly used to yield most preferable results in basic properties such as an oxygen shielding property and removability at development. Polyvinyl alcohol used in the protective layer may be partially substituted with an ester, ether or acetal as long as it contains an unsubstituted vinyl alcohol unit for exhibiting a necessary oxygen shielding property and water solubility. Further, polyvinyl alcohol may partially have other copolymerizable component.

As specific examples of polyvinyl alcohol, those having grades within the hydrolysis range of 71 to 100% and having molecular weights of 300 to 2400 are preferable. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 and the like manufactured by Kuraray Co., Ltd. are listed.

The components (selection of PVA, use of additives), coating amount and the like of the protective layer are selected in consideration of an oxygen shielding property and removability at development, and additionally, fogging property, adherence and scratch resistance. In general, when the hydrolysis ratio of PVA used is higher (the unsubstituted vinyl alcohol unit content in the protective layer is higher) and the film thickness is larger, the oxygen shielding property increases, to thereby produce good sensitivity. However, when the oxygen shielding property is excessively enhanced, problems arise in that an unnecessary polymerization reaction in production and in storage takes place, and that unnecessary fogging and broadening of image lines in image-wise exposure are produced. Further, adhesion of the protective layer to image areas and scratch resistance of the layer are also serious issues in handling of a plate. Namely, when a hydrophilic layer made of a water-soluble polymer is laminated on a lipophilic polymerization layer, film peeling due to adhering deficiency tends to occur, and the peeled part produces defects such as poor film hardening and the like by polymerization hindrance by oxygen.

In view of the foregoing, there are various proposals for improving adhesion between these two layers. For example, it is set forth in U.S. Pat. No. 4,072,527 and JP-A No. 47-469 that sufficient adhesion can be achieved if an acrylic emulsion or water-insoluble vinylpyrrolidone-vinyl acetate copolymer or the like is mixed in an amount of 20 to 60% by weight into a hydrophilic polymer mainly composed of polyvinyl alcohol and the resultant mixture is laminated on a polymerization layer. To the protective layer in the present invention, any of these known techniques can be applied. Such methods for providing the protective layer are described in detail, for example, in U.S. Pat. No. 3,458,311 and JP-A No. 55-49729.

In addition, other functions can also be imparted to the protective layer. For example, safe light suitability can be further enhanced without causing decrease in sensitivity by adding a coloring agent (water-soluble dye or the like) excellent in transmissivity of light used in exposure (for example, infrared ray having a wavelength of from about 760 nm to 1200 nm used for the image recording material of the present invention) and capable of efficiently absorbing light of wavelengths not utilized for exposure.

Substrate

As the substrate on which the image forming material of the present invention can be disposed, dimensionally stable plates are mentioned, including for example, paper, paper laminated with a plastic (for example, polyethylene, polypropylene, polystyrene and the like), metal plate (for example, aluminum, zinc, copper and the like), plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like), paper laminated or vapor-deposited with metals described above, plastic films and the like.

As the substrate used in the image recording material of the present invention, polyester films and aluminum plates are preferable, and particularly, aluminum plates excellent in dimension stability and relatively inexpensive are particularly preferable. The suitable aluminum plates are pure aluminum plates and alloy plates containing aluminum as the main component and containing a trace amount of extraneous elements, and further, plastic films laminated or vapor-deposited with aluminum may also be employable. As the extraneous elements contained in aluminum alloys, silicon, iron, manganese, copper, magnesium, chromium, zinc, bismuth, nickel, titanium and the like are mentioned. The content of extraneous elements in an alloy is 10% by weight or less. In the present invention, the particularly suitable aluminum is pure aluminum, however, since completely pure aluminum cannot be produced easily from the standpoint of refining technologies, aluminum containing a slight amount of extraneous elements may also be employable. The aluminum plate thus applied to the invention is not specified in its composition, and aluminum plates made of conventionally known and used materials can appropriately be utilized. The aluminum plate used in the invention has a thickness of about 0.1 mm to about 0.6 mm, preferably of 0.15 mm to 0.4 mm, particularly preferably of 0.2 mm to 0.3 mm.

Prior to roughening an aluminum plate, degreasing treatment is conducted using, for example, a surfactant, an organic solvent or an aqueous alkaline solution for removing a rolling oil on the surface of the plate, as desired.

The roughening treatment on the surface of an aluminum plate is conducted by various methods, for example, a method of mechanically roughening the surface, a method of electrochemically dissolving for roughening the surface, and a method of selectively dissolving the surface chemically. As the mechanical method, known methods can be used such as a ball polishing method, brush polishing method, blast polishing method, buff polishing method and the like. As the electrochemical roughening method, there are mentioned a method employing alternating current or direct current in a hydrochloric acid or nitric acid electrolyte. Also, as disclosed in JP-A No. 54-63902, a combination of the above methods can also be employed.

The thus roughened aluminum plate is, as necessary, subjected to alkali etching or neutralization, then undergoes anodizing treatment for enhancing the water retention and friction resistance of the surface, as desired. As the electrolyte used for anodizing treatment of an aluminum plate, various electrolytes for forming a porous oxide film can be used, and in general, sulfuric acid, phosphoric acid, oxalic acid, chromic acid or a mixed acid thereof is used. The concentration of these electrolytes is appropriately determined depending on the kind of the electrolyte used.

Treating conditions for anodization vary depending on the electrolyte used, and consequently, the conditions cannot be specified generically. However, in general, it is suitable if the concentration of the electrolyte is 1 to 80% by weight, the liquid temperature is 5 to 70° C., the current density is 5 to 60A/dm$^2$, the voltage is 1 to 100V, and the electrolysis time is 10 seconds to 5 minutes.

When the amount of an anodized film is less than 1.0 g/m$^2$, printing durability becomes insufficient or non-image areas of a planographic printing plate are easily scratched, and so-called "scratch-staining" in which ink adheres to a scratched part in printing is likely to occur.

After anodization, hydrophilizing treatment is performed on the aluminum surface, as necessary. As the hydrophilizing treatment used in the present invention, a method using an alkali metal silicate (e.g., an aqueous sodium silicate solution) is disclosed in U.S. Pat. Nos. 2,714,066, 3,181,461, 3,280,734 and 3,902,734. In this treatment, the substrate is immersed in an aqueous sodium silicate solution or subjected to electrolysis. Additional methods employable for this treatment are disclosed in JP-B No. 36-22063 which uses potassium fluorozirconate and disclosed in U.S. Pat. Nos. 3,276,868, 4,153,461 and 4,689,272 which use polyvinylphosphonic acid.

The image recording material of the present invention comprises a substrate having disposed thereon a recording layer containing the image forming material, and if necessary, an undercoat layer can be provided therebetween.

As the components for the undercoat layer, various organic compounds are used, including for example, carboxylmethyl cellulose, dextrin, gum arabic, phosphonic acids having an amino group such as 2-aminoethylphosphonic acid and the like, organic phosphonic acids such as phenylphosphonic acid, naphthylphosphonic acid, alkylphosphonic acid, glycerophosphonic acid, methylenediphosphonic acid and ethylenediphosphonic acid optionally having a substituent, organic phosphoric acids such as phenylphosphoric acid, naphthylphosphoric acid, alkylphosphoric acid and glycerophosphoric acid optionally having a substituent, organic phosphinic acids such as phenylphosphinic acid, naphthylphosphinic acid, alkylphosphinic acid and glycerophosphinic acid optionally having a substituent, hydrochlorides of amino acids, e.g., glycine, β-alanine, amines having a hydroxyl group such as a hydrochloride of triethanolamine, and the like are selected, and two or more thereof may be used in admixture.

After the aforementioned treatments and undercoating are performed on the surface of a substrate, a backcoat is provided, if necessary, on the rear surface of the substrate. As such a backcoat, preferably provided is a coating layer made of a metal oxide obtained by hydrolysis and polycondensation of an organic or inorganic metal compound described in JP-A No. 6-35174 and an organic polymer compound described in JP-A No. 5-45885. Of these coating layers, alkoxy silicon compounds such as $Si(COH_3)_4$, $Si(OC_2H_5)_4$, $Si(OC_3H_7)_4$, $Si(OC_4H_9)_4$ and the like are particularly preferable since they are inexpensive and readily available, and a coating layer made of a metal oxide obtained therefrom is particularly preferable in view of good developer resistance.

The preferable property as a planographic printing plate substrate is a center line average roughness of 0.10 to 1.2 μm. When lower than 0.10 μm, adhesion to a photosensitive layer lowers, leading to serious decrease in printing durability. When over 1.2 μm, staining property in printing is worsened. Further, regarding the color density of a substrate, the value of reflective density is from 0.15 to 0.65, and if the value is less than 0.15 to exhibit whiter hue, halation in image exposure is too intense, causing problems in image formation, whereas if the value is more than 0.65 to exhibit blacker hue, the image formed is low in visibility during inspecting the produced plates after development, yielding remarkably poor results of the plate.

As described above, a planographic printing plate precursor can be produced by using the image recording material of the present invention. This planographic printing plate precursor can be recorded by irradiation with an infrared laser. Thermal recording by means of an ultraviolet lamp or a thermal head is also possible. In the present invention, recording is preferably conducted through light exposure by means of a solid laser or a semiconductor laser emitting infrared rays having wavelengths from 760 nm to 1200 nm. The output of laser is preferably 100 mW or more, and it is preferable, for shortening exposure time, to use a multi-beam laser device. The exposure time per pixel is preferably $20\mu$ seconds or less. The energy applied to a recording material is preferably from 10 to 300 mJ/cm$^2$.

After exposure to an infrared laser, the image recording material of the present invention is preferably developed with water or an aqueous alkaline solution.

In the present invention, although developing treatment may be conducted immediately after laser irradiation, a heat treatment may be carried out between laser irradiation and development. The heat treatment is preferably conducted at 80° C. to 150° C. for 10 seconds to 5 minutes. By this heat treatment, laser energy necessary for recording can be reduced for laser irradiation.

As the developer, an aqueous alkaline solution is preferable. A preferable pH range is from 10.5 to 12.5, and developing treatment with an aqueous alkaline solution in a pH range from 11.0 to 12.5 is further preferable. When an aqueous alkaline solution having a pH of lower than 10.5 is used, stains are likely to occur at non-image areas, and when developing treatment is effected using an aqueous solution having a pH of over 12.5, strength at image areas may possibly lower.

When an aqueous alkaline solution is used as the developer, conventionally known alkali aqueous solutions can be used as the developer and the replenisher for the image recording material of the present invention. For this use, inorganic alkali salts are listed, such as for example, sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide, and the like. Further, organic alkali agents are also listed, such as for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like.

These alkali agents are used singly or in combination of two or more.

Further, it is known that when an automatic developing machine is used for development, a large amount of planographic printing plate precursors can be treated by adding to a developer an aqueous solution having the same alkali strength as that of the developer or an aqueous solution having higher alkali strength than that of the developer (replenisher), without exchanging a developer in a developing tank for a long period of time. This replenishing mode may preferably be applied in the present invention.

To the developer and the replenisher, various surfactants and organic solvents and the like may be added, as necessary, for the purposes of promoting or suppressing developing property, dispersing the produced residues after development, and enhancing ink affinity of image areas in a printing plate.

It is preferable to add a surfactant to a developer in an amount preferably of 1 to 20% by weight, more preferably of 3 to 10% by weight. When the addition amount of a surfactant is less than 1% by weight, an effect of improving developing property is not obtained sufficiently, and when added in an amount of over 20% by weight, problems are likely to arise in that strength such as friction resistance at image areas is decreased.

As the preferable surfactant, anionic, cationic, nonionic and amphoteric surfactants are mentioned. Specific examples of the surfactant include a sodium salt of lauryl alcohol sulfate, an ammonium salt of lauryl alcohol sulfate, a sodium salt of octyl alcohol sulfate, alkylarylsulfonates such as a sodium salt of isopropylnaphthalenesulfonic acid, a sodium salt of isobutylnaphthalenesulfonic acid, a sodium salt of polyoxyethylene glycol mononaphthyl ether sulfuric acid ester, a sodium salt of dodecylbenzenesulfonic acid, a sodium salt of metanitrobenzenesulfonic acid and the like, higher alcohol sulfuric acid esters having 8 to 22 carbon atoms such as secondary sodium alkyl sulfates and the like, salts of aliphatic alcohol phosphoric acid esters such as a sodium salt of a cetyl alcohol phosphate and the like, sulfonate of alkylamides such as $C_{17}H_{33}CON(CH_3)CH_2CH_2SO_3Na$ and the like, sulfonate of dibasic aliphatic esters such as dioctyl sodium sulfosuccinate, dihexyl sodium sulfosuccinate and the like, ammonium salts such as lauryltrimethylammonium chloride, lauryltrimethylammonium methosulfate and the like, amine salts such as salts of stearamideethyldiethylamine acetate and the like, polyhydric alcohols such as aliphatic monoesters of glycerol, aliphatic monoesters of pentaerythritol and the like, polyethylene glycol ethers such as polyethylene glycol mononaphthyl ether, polyethylene glycol mono(nonylphenol) ether and the like, and other surfactants.

As the preferable organic solvent, those having solubility in water of about 10% by weight or less are mentioned. Preferably, those having solubility in water of 5% by weight or less are chosen. For example, 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol are listed. The use amount of an organic solvent is suitably from 1 to 5% by weight based on the total weight of a developer used. This use amount has a close relation with the use amount of a surfactant. When the amount of an organic solvent used increases, the amount of a surfactant is preferably increased accordingly. The reason therefor is that if an organic solvent is used in a large amount in spite of a small amount of a surfactant therein, the organic solvent is not dissolved, and consequently, an excellent developing property cannot be expected.

The developer and the replenisher may further contain, as necessary, additives such as a defoaming agent, hard water softening agent and the like. Examples of the hard water softening agent include polyphosphates such as $Na_2P_2O_7$, $Na_5P_3O_3$, $Na_3P_3O_9$, $Na_2O_4P(NaO_3P)PO_3Na_2$, calgon (sodium polymetaphosphate); aminopolycarboxylic acids such as ethylenediaminetetraacetic acid, potassium salt thereof, sodium salt thereof; diethylenetriaminepentaacetic acid, potassium salt thereof, sodium salt thereof; triethylenetetraaminehxaacetic acid, potassium salt thereof, sodium salt thereof; hydroxyethylethelenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanoltetraacetic acid, potassium salt thereof, sodium salt thereof, and the like; and additionally, organic phosphonic acids such as 2-phosphonobutane-1,2,4-tricarboxylic acid, potassium salt thereof, sodium salt thereof; 2-phosphonobutane-2,3,4-tricarboxylic acid, potassium salt thereof, sodium salt thereof; 1-phosphonoethane-1,2,2-tricarboxylic acid, potassium salt thereof, sodium salt thereof; 1-hydroxyethane-1,1-diphosphonic acid, potassium salt thereof, sodium salt thereof; aminotri(methylenephosphonic acid), potassium salt thereof, sodium salt thereof; and the like. The optimum amount of such a hard water softening agent varies depending on the hardness of hard water used. The use amount of the hard water softening agent is usually from 0.01 to 5% by weight, more preferably from 0.01 to 0.5% by weight relative to a developer used.

Further, when an automatic developing machine is used for developing a planographic printing plate, the developer fatigues according to the processing amount. Therefore, a replenisher or a fresh developer may be used to recover a processing ability. In this case, replenishing is conducted preferably using a method described in U.S. Pat. No. 4,882,246.

As the developer containing a surfactant, an organic solvent and a developing agent and the like, for example, a composition composed of benzyl alcohol, an anionic surfactant, an alkali agent and water described in JP-A No. 51-77401, a composition composed of benzyl alcohol, an anionic surfactant, and an aqueous solution containing a water-soluble sulfite described in JP-A No. 53-44202, a composition containing an organic solvent having a solubility in water at room temperature of 10% by weight or less, an alkali agent and water described in JP-A No. 55-155355, and the like are mentioned for suitably use as the developer in the present invention.

A printing plate developed using the developer and the replenisher as describe above is post-treated with a rinsing liquid containing a washing water, surfactant and the like, and with a de-sensitizing liquid containing gum arabic and a starch derivative. When the image recording material of the present invention is used as a printing plate precursor, post-treatment can be carried out in various combinations of these treatments.

Recently, for rationalization and standardization of plate-making work, automatic developing machines for printing plate materials are widely used in the plate-making and printing industry. This automatic developing machine generally consists of a development unit and a post-treatment unit and is composed of an apparatus for conveying printing plate materials, a treating liquid bath and a spraying apparatus, by which treating liquids pumped are sprayed from spraying nozzles while horizontally conveying the exposed printing plates, to thus carry out developing treatment. Recently, there is also known a method in which a printing plate precursor is treated by being immersed in a treating liquid bath filled with a treating liquid and conveyed through a submerged guide roll. In such an automatic treatment, printing plate precursors can be treated while replenishing a replenisher to respective treating liquids depending on the processing amount and operating time and the like. Further, by detecting electric conductivity by means of a sensor, the replenisher can automatically be replenished.

Also applicable is a so-called disposable processing mode by which treatment is effected by substantially supplying an un-used treating liquid.

The planographic printing plate obtained as above can be subjected to a printing process after applying coating of de-sensitizing rubber, as necessary. If a planographic printing plate is required to exhibit higher printing durability, burning treatment is performed.

When a planographic printing plate is subjected to burning, treatment with a surface smoothing liquid is conducted before burning as described in JP-B Nos. 61-2518 and 55-28062 and JP-A Nos. 62-31859 and 61-159655.

For this treatment, a method for applying coating onto a planographic printing plate using a sponge or an absorbent cotton impregnated with the surface smoothing liquid, a method for applying coating by immersing a printing plate in a bat filled with the surface smoothing liquid, a method for applying coating by an automatic coating machine, and the like are employed. Further, more preferable results are produced if, after applying coating, the coating amount is made uniform using a squeegee or a squeegee roller.

The suitable coating amount of the surface smoothing liquid is usually from 0.03 to 0.8 $g/m^2$ (dry weight).

The planographic printing plate coated with the surface smoothing liquid is subjected, as necessary after drying, to heat treatment to an elevated temperature by a burning processor (for example, BP-1300 available from Fuji Photo Film Co., Ltd.) and the like. In this case, heating is conducted preferably at temperatures of from 180 to 300° C. for 1 to 20 minutes, depending on the kinds of components used for forming images.

The thus burnt planographic printing plate is then subjected to conventionally conducted treatments such as water-washing, gumming and the like, as necessary. In case of using a surface smoothing liquid containing a water-soluble polymer compound, a so-called de-sensitizing treatment such as gumming can be omitted.

The planographic printing plate treated as above is charged in an offset printing machine or the like and is used for printing a large number of sheets.

EXAMPLES

The present invention will be illustrated in detail by the following examples, but it is to be understood that the invention is not limited thereto.

Examples 1 to 8
Production of Substrate

A forging bath of JIS A1050 alloy containing 99.5% or more of aluminum, 0.30% of Fe, 0.10% of Si, 0.02% of Ti and 0.013% of Cu was subjected to cleaning treatment and then cast. For the cleaning treatment, de-gassing treatment was conducted to remove unnecessary gases such as hydrogen in the forging bath, followed by filtration using a ceramic tube filter. Casting was carried out through a DC casting method. The hardened ingot having a thickness of 500 mm was scraped at the surface in a 10 mm thickness, and subjected to homogenization at 550° C. for 10 hours so that an intermetallic compound would not grow to coarse particles. Then, the resultant ingot was hot-rolled at 400° C., and subjected to intermediate annealing at 500° C. for 60 seconds in a continuous annealing furnace, followed by cold rolling, to thereby obtain a rolled plate of aluminum having a thickness of 0.30 mm. By regulating the roughness of the rolling roll, the center liner average surface roughness (Ra) after cold rolling was controlled to 0.2 µm. Thereafter, the ingot was passed through a tension leveler to improve flatness.

Next, the resultant ingot was surface-treated for forming a substrate to produce a planographic printing plate.

First, in order to remove a rolling oil on the surface, the aluminum plate was de-greased at 50° C. for 30 seconds with a 10% aqueous sodium aluminate solution, neutralized at 50° C. for 30 seconds with a 30% aqueous sulfuric acid solution, followed by smut removing treatment.

The resultant aluminum plate underwent so-called graining treatment for roughening the surface to enhance adhesiveness of the substrate to a photosensitive layer and impart water retention to non-image areas. Electrolytically graining was conducted by applying to an anode an electricity of 240 C/dm$^2$ from an indirect supplying cell, at a current density of 20 A/dm$^2$ and alternating waveform of duty ratio 1:1, while floating the aluminum plate (web) in an aqueous solution containing 1% nitric acid and 0.5% aluminum nitrate maintained at 45° C. Thereafter, the aluminum web was subjected to etching treatment at 50° C. for 30 seconds using a 10% aqueous sodium aluminate solution, neutralized at 50° C. for 30 seconds with a 30% aqueous sulfuric acid solution, followed by smut removing treatment.

Further, in order to improve friction resistance, chemical resistance and water retention, an oxide film was formed on the aluminum plate (web) for use as the substrate by anodization. Electrolysis was conducted by applying a direct current of 14 A/dm$^2$ from an indirect supplying cell while conveying the aluminum web in a 20% aqueous sulfuric acid solution maintained at 35° C. and used as an electrolyte, to produce an anodized film of 2.5 g/m$^2$.

Then, the resultant aluminum web underwent silicate treatment for securing hydrophilicity at non-image areas of a printing plate. In this treatment, the aluminum web was conveyed through a 1.5% aqueous No. 3 sodium silicate solution kept at 70° C., and washed with water while controlling the contact time of 15 seconds. The deposit amount of Si was 10 mg/m$^2$. The thus produced aluminum substrate had a Ra (center line surface roughness) of 0.25 µm.

Undercoat

Next, the following coating liquid for an undercoat was applied using a wire bar onto the aluminum substrate produced as above, and dried at 90° C. for 30 seconds using a hot air type drier. The coating amount after dried was 10 mg/m$^2$.

| <Coating liquid for an undercoat> | |
|---|---|
| Copolymer of ethyl methacrylate and sodium 2-acrylamide-2-methyl-1-propanesulfonate (molar ratio of 75:15) | 0.1 g |
| 2-Aminoethylphosphonic acid | 0.1 g |
| Methanol | 50 g |
| Ion exchange water | 50 g |

Photosensitive Layer

Then, the following coating liquids for a photosensitive layer [P] was prepared, and applied immediately after their preparation onto the undercoated aluminum plates by means of a wire bar, followed by drying at 115° C. for 45 seconds using a hot air type drier, to thereby obtain negative-type planographic printing plate precursors [P-1] to [P-6]. The coating amount after dried was 1.3 g/m$^2$. The infrared absorbents and the radical-generating agents used in this operation are shown in Table 10 below. Reflective densities of the photosensitive layer of these planographic printing plate precursors at the absorption maximum in the infrared ray region were determined, and all of the density values were found to range from 0.6 to 1.2.

| <Coating liquids for a photosensitive layer [P]> | |
|---|---|
| Infrared absorbent (the compound shown in TABLE 10) | 0.10 g |
| Radical-generating agent (the compound shown in TABLE 10) | 0.30 g |
| Dipentaerythritol hexaacrylate | 1.00 g |
| Copolymer of allyl methacrylate and methacrylic acid (molar ratio of 80:20, weight-average molecular weight of 120,000) | 1.00 g |
| Naphthalenesulfonate of Victoria Pure Blue | 0.04 g |
| Fluorine-based surfactant (Megafack F-176, manufactured by Dainippon Ink & Chemicals, Inc.) | 0.01 g |
| Methyl ethyl ketone | 9.0 g |
| Methanol | 10.0 g |
| 1-Methoxy-2-propanol | 8.0 g |

TABLE 10

| | Planographic printing plate | Infrared absorbent | Radical-generating agent |
|---|---|---|---|
| Example 1 | [P-1] | IR-1 | OI-5 |
| Example 2 | [P-2] | IR-1 | ON-2 |
| Example 3 | [P-3] | IR-1 | OS-4 |
| Example 4 | [P-4] | IR-25 | OS-4 |
| Example 5 | [P-5] | IR-1 | OS-6 |
| Example 6 | [P-6] | IR-19 | OS-6 |
| Comparative Example 1 | [Q-1] | NK-2014 | OI-5 |
| Comparative Example 2 | [Q-2] | | ON-2 |
| Comparative Example 3 | [Q-3] | | OS-4 |

Exposure

The thus produced negative-type planographic printing plate precursors [P-1] to [P-6] were exposed to light using TRENDSETTER 3244VFS (manufactured by Creo Inc.) equipped with a water cooling-type 40 W infrared semiconductor laser emitter having an output of 9 W, under the conditions of an outer surface drum revolution of 210 rpm, a plate surface energy of 100 mJ/cm$^2$ and a resolution of 2400 dpi.

Developing Treatment

After light exposure, the planographic printing plate precursors were developed using an automatic developing machine STABRON 900N (manufactured by Fuji Photo Film Co., Ltd.), using a dilution (1:1 with water) of DN-3C (manufactured by Fuji Photo Film Co., Ltd.) both as a charging solution and as a replenisher. In this operation, temperature of the developing bath was maintained at 30° C., and a dilution (1:1 with water) of FN-6 (manufactured by Fuji Photo Film Co., Ltd., pH=10.8) was used as a finisher.

Evaluation of Staining in Printing

The planographic printing plates [P-1] to [P-6] obtained as above were printed with a commercially available oil-based ink using a printer HYDEL SOR-M (manufactured by Heidelberg K.K.). In this operation, occurrence of staining at non-image areas was visually evaluated. The results are shown in Table 11 below, revealing that no staining occurred in any of the planographic printing plates.

Number of Printed Sheets

Then, the planographic printing plates [P-1] to [P-6] obtained as above were printed by means of a printer LISRON (manufactured by Komori Corporation). In this operation, the printed sheets were visually inspected to evaluate if sufficient ink density is achieved and the number of sufficiently printed sheets was counted. The results are also shown in Table 11.

Comparative Examples 1 to 3

Coating liquids were prepared, applied and dried to obtain planographic printing plate precursors [Q-1] to [Q-3] in the same manner as conducted in Examples 1 to 3 to prepare coating liquids for a photosensitive layer [P], except that an infrared absorbent NK-2014 having the following structure (manufactured by Hayashibara Biochemical Laboratories, Inc., Photosensitive Dye Laboratories) was used instead of the infrared absorbents of the present invention. Details of the radical-generating agents and the like used are shown in Table 11.

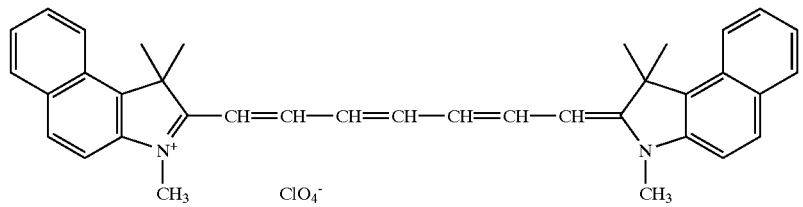

NK-2014

The thus produced planographic printing plate precursors [Q-1] to [Q-3] were exposed to light and developed in the same manner as performed in Examples 1 to 6, to thereby obtain planographic printing plates [Q-1] to [Q-3]. Further, the obtained plates were printed in the same manner as conducted in Examples 1 to 6, and occurrence of staining at non-image areas was visually evaluated. The results are shown in Table 11 below.

TABLE 11

| | Planographic printing plate | Staining at non-image areas | Number of printed sheets |
|---|---|---|---|
| Example 1 | [P-1] | No occurrence | 70,000 |
| Example 2 | [P-2] | No occurrence | 65,000 |
| Example 3 | [P-3] | No occurrence | 65,000 |
| Example 4 | [P-4] | No occurrence | 80,000 |
| Example 5 | [P-5] | No occurrence | 70,000 |
| Example 6 | [P-6] | No occurrence | 75,000 |
| Comparative Example 1 | [Q-1] | No occurrence | 40,000 |
| Comparative Example 2 | [Q-2] | Slightly stained | 45,000 |
| Comparative Example 3 | [Q-3] | No occurrence | 35,000 |

As apparent from the results shown in Table 11, the planographic printing plates of the present invention, which were produced using as the infrared absorbent a cyanine dye in which at least one substituent on a nitrogen atom in a heterocyclic ring at each end forms a cyclic ring which includes a methine chain, can provide a large number of printed sheets without causing staining at non-image areas, although these planographic printing plates were developed and made without undergoing heat treatment after light exposure for forming images. On the other hand, with regard to the comparative examples in which the infrared absorbent used for recording materials was outside of the scope of the present invention yielded a smaller number of printed sheets in comparison to that achieved in the examples, and in some cases slight staining at non-image areas was found depending on the onium salts used.

Examples 7 and 8

The following coating liquids for a photosensitive layer [R] was prepared and applied immediately after their preparation onto the undercoated aluminum substrates obtained in Examples 1 to 6 by means of a wire bar, followed by drying using a hot air type drier at 115° C. for 45 seconds, to thereby produce negative-type planographic printing plate precursors [R-1] and [R-2]. The coating amount after dried was 1.3 g/m². The infrared absorbents and the radical-generating agents used in this operation are shown in Table 12 below.

<Solution [R]>

| | |
|---|---|
| Infrared absorbent (the compound shown in TABLE 12) | 0.10 g |
| Radical-generating agent (the compound shown in TABLE 12) | 0.30 g |
| Polyfunctional monomer having the structure shown below | 1.00 g |
| Addition polymer of 4,4'-diphenylmethane diisocyanate, hexamethylene diisocyanate, tetraethylene glycol and 2,2-bis(hydroxymethyl)propionic acid (molar ratio of 30:20:30:20, weight-average molecular weight of 60,000) | 1.00 g |
| Naphthalenesulfonate of Victoria Pure Blue | 0.04 g |
| Fluorine-based surfactant (Megafack F-176, manufactured by Dainippon Ink & Chemicals, Inc.) | 0.01 g |
| Methyl ethyl ketone | 5.0 g |
| Methanol | 10.0 g |
| 1-Methoxy-2-propanol | 8.0 g |
| Methyl lactate | 2.0 g |
| γ-Butyrolactone | 2.0 g |

Structure of the monomer

TABLE 12

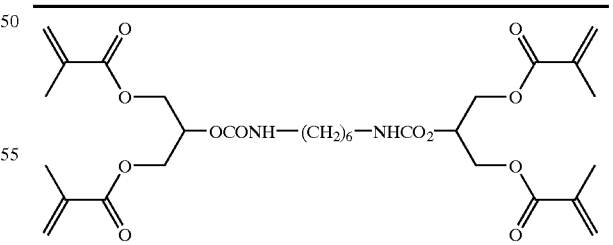

| Planographic printing plate | Infrared absorbent | Radical-generating agent |
|---|---|---|
| Example 7 | [R-1] | IR-1 | OS-4 |
| Example 8 | [R-2] | IR-26 | OS-6 |
| Comparative Example 4 | [S-1] | NK-2014 | OS-4 |

Exposure

The thus produced negative-type planographic printing plate precursors [R-1] and [R-2] were exposed to light using Luxel T-9000CTP (manufactured by Fuji Photo Film Co., Ltd.) equipped with a multi-channel laser head having an output of 250 mW per beam, under the conditions of an outer surface drum revolution of 800 rpm and a resolution of 2400 dpi.

In order to evaluate printing durability under low exposure conditions, the planographic printing plate precursors were exposed to light in the same manner as conducted above, except that the output of the laser per beam was changed to 150 mW using the same exposing apparatus as employed above.

After light exposure, the planographic printing plate precursors were developed in the same manner as conducted in Examples 1 to 6, to obtain planographic printing plates [R-1] and [R-2]. The thus obtained planographic printing plates [R-1] and [R-2] were evaluated for staining in printing and the number of sufficiently printed sheets in the same manner as conducted in Examples 1 to 8. The results are shown in Table 13 below.

Comparative Example 4

A coating liquid was prepared, applied and dried to obtain a planographic printing plate precursor [S-1] in the same manner as carried out in Examples 7 and 8 to prepare a coating liquid for a photosensitive layer [R], except that the above-mentioned NK-2014 was used in place of the infrared absorbents of the present invention. Details of the radical-generating agent and the like used are shown in Table 13.

The thus produced planographic printing plate precursor [S-1] was exposed to light and developed in the same manner as conducted in Examples 7 and 8 to thereby obtain a planographic printing plate [S-1]. This plate was printed in the same manner as performed in Examples 7 and 8 and occurrence of staining at non-image areas was visually evaluated. The results are shown in Table 13.

TABLE 13

| | Planographic printing plate | (Exposure: output per beam of 250 mW) | | (Exposure: output per beam of 150 mW) | |
|---|---|---|---|---|---|
| | | Staining at non-image areas | Number of printed sheets | Staining at non-image areas | Number of printed sheets |
| Example 7 | [R-1] | No occurrence | 50,000 | No occurrence | 35,000 |
| Example 8 | [R-2] | No occurrence | 65,000 | No occurrence | 45,000 |
| Comparative Example 4 | [S-1] | No occurrence | 25,000 | No occurrence | Less than 5,000 |

As apparent from the results shown in Table 13, any of the planographic printing plates [R-1] and [R-2], obtained in the examples of the present invention, can produce a large number of printed sheets without causing staining at non-image areas. It is also revealed that in the planographic printing plates of the present invention, staining does not occur at non-image areas even under low exposure conditions, thus achieving satisfactory printing durability of practically employable level.

On the other hand, the planographic printing plate obtained in the comparative example [S-1], in which an infrared absorbent used for the recording material was outside of the scope of the present invention, yielded a smaller number of printed sheets in comparison to the plate obtained in Example 7, which employed the same conditions except for the infrared absorbent used. Particularly, under low exposure conditions, a decrease in the number of printed sheets was remarkable.

Examples 9 to 12, Comparative Examples 5 and 6
Production of Substrate

Aluminum substrates were produced in the same manner as conducted in Examples 1 to 6, except that silicate treatment for securing hydrophilicity was not conducted.
Undercoat Then, the following coating liquid for an undercoat was applied using a wire bar onto the aluminum substrates produced as above, and dried at 90° C. for 30 seconds using a hot air type drier. The coating amount after dried was 10 mg/m².

| <Coating liquid for an undercoat> | |
|---|---|
| β-Alanine | 0.1 g |
| Phenylphosphonic acid | 0.1 g |
| Methanol | 40 g |
| Water | 60 g |

Photosensitive Layer

Then, coating liquids for a photosensitive layer were prepared in the same manner as conducted in Examples 1 to 6 to produce the coating liquids for a photosensitive layer [P], except that the infrared absorbents and the radical-generating agents used were changed to those shown in Table 14, and applied onto the undercoated aluminum plate by means of a wire bar and then dried, to thereby obtain negative-type planographic printing plate precursors [P-7] to [P-10] and [Q-5] and [Q-6].

TABLE 14

| | Planographic printing plate | Infrared absorbent | Radical-generating agent |
|---|---|---|---|
| Example 9 | [P-7] | IR-34 | OI-5 |
| Example 10 | [P-8] | IR-1 | OS-4 |
| Example 11 | [P-9] | IR-9 | OS-6 |
| Example 12 | [P-10] | IR-26 | OS-6 |
| Comparative Example 5 | [Q-5] | NK-2014 | OI-5 |
| Comparative Example 6 | [Q-6] | | OS-6 |

The thus produced planographic printing plate precursors were exposed to light and developed in the same manner as in Examples 1 to 6, except that the developer was changed to the following developer, to thus obtain planographic printing plates [P-7] to [P-10] and [Q-5] and [Q-6].

| <Developer> | |
|---|---|
| Potassium hydroxide | 3.8 g |
| Polyethylene glycol mononaphthyl ether | 250 g |
| Tetrasodium ethylenediaminetetraacetate | 8 g |
| Water | 738 g |
| (pH = 11.7) | |

Further, the obtained planographic printing plates were printed in the same manner as performed in Examples 1 to 6, and occurrence of staining at non-image areas was visually evaluated. The results are shown in Table 15 below.

TABLE 15

|  | Planographic printing plate | Staining at non-image parts | Number of printed sheets |
| --- | --- | --- | --- |
| Example 9 | [P-7] | No occurrence | 65,000 |
| Example 10 | [P-8] | No occurrence | 85,000 |
| Example 11 | [P-9] | No occurrence | 70,000 |
| Example 12 | [P-10] | No occurrence | 80,000 |
| Comparative Example 5 | [Q-5] | No occurrence | 55,000 |
| Comparative Example 6 | [Q-6] | No occurrence | 50,000 |

As apparent from the results shown in Table 15, in any of the planographic printing plates [P-7] to [P-10], which were obtained in the examples of the present invention, staining did not occur at non-image areas, and a large number of printed sheets were achieved.

On the other hand, the planographic printing plates obtained in Comparative Examples 5 and 6, in which the infrared absorbent used for the recording materials was outside of the scope of the present invention, yielded a smaller number of the printed sheets in comparison to the planographic printing plates obtained in Examples 9 and 11, which employed the same conditions except for the infrared absorbent used.

According to the present invention, there is provided a negative-type image recording material onto which images can directly be recorded based on digital data from a computer or the like using a solid laser or a semiconductor laser emitting infrared ray, and which, when used as a planographic printing plate, has high sensitivity and printing durability good enough to yield a large number of printed sheets without undergoing heat treatment for forming images.

What is claimed is:

1. An image recording material onto which images can be recorded with an infrared ray, the material comprising an infrared absorbent, wherein said infrared absorbent is a cyanine dye in which at least one substituent on a nitrogen atom in a heterocyclic ring at each end forms a cyclic ring which includes a methine chain.

2. The image recording material according to claim 1, wherein the infrared absorbent is a dye represented by at least one of the following general formulae:

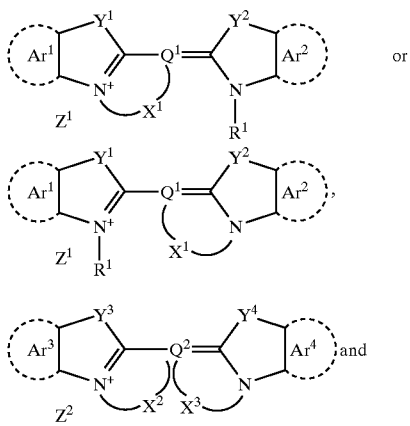

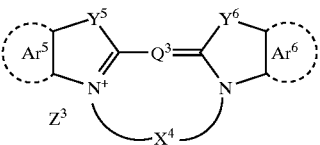

wherein $R^1$ represents an optionally substituted hydrocarbon group having 20 or less carbon atoms; $Ar^1$ to $Ar^6$ each independently represent an optionally substituted aromatic hydrocarbon group or an optionally substituted heterocyclic group; $Y^1$ to $Y^6$ may be the same or different, each represent a sulfur atom, an oxygen atom, a selenium atom, a dialkylmethylene group having 12 or less carbon atoms, a —CH=CH— group or an —NR$^2$— group in which $R^2$ represents the same substituent as defined for $R^1$; $Q^1$ to $Q^3$ represent a pentamethine group or a heptamethine group; $Z^1$ to $Z^3$ represent a counter ion necessary for neutralizing electric charges; and $X^1$ to $X^4$ each independently represent a divalent organic group necessary for forming a cyclic ring.

3. The image recording material according to claim 2, wherein the infrared absorbent is a heptamethinecyanine dye having at least one of an indolenine skeleton and a benzindolenine skeleton.

4. The image recording material according to claim 1, wherein the infrared absorbent is a dye represented by at least one of the following general formulae (5) and (6):

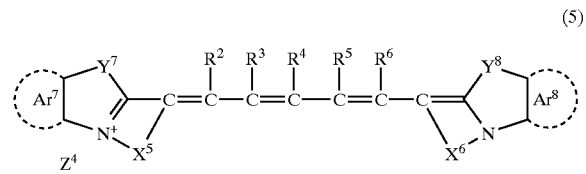

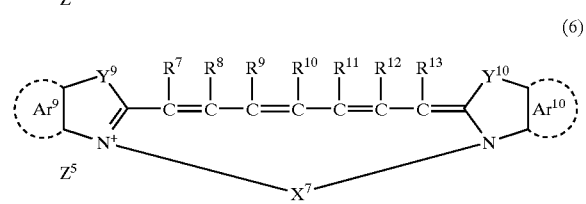

wherein $R^2$ to $R^{13}$ each independently represent a hydrogen atom or a substituent selected from the group consisting of alkoxy groups, aryloxy groups, alkylthio groups, arylthio groups, dialkylamino groups, diarylamino groups, halogen atoms, alkyl groups, aryl groups, oxy groups and the substituent represented by the following general formula (4):

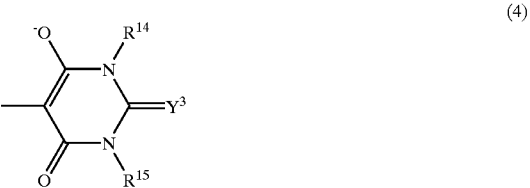

in which $R^{14}$ and $R^{15}$ each represent the same substituent as defined for $R^2$ to $R^{13}$, and $Y^3$ represents an oxygen atom or a sulfur atom; $Ar^7$ to $Ar^{10}$ each independently represent an optionally substituted aromatic hydrocarbon group or an optionally substituted heterocyclic group; $Y^7$ to $Y^{10}$ may be the same or different, each represent a sulfur atom, an oxygen atom, a selenium atom, a dialkylmethylene group having 12 or less carbon atoms, a —CH=CH— group or an —$NR^{16}$— group in which $R^{16}$ represents an optionally substituted hydrocarbon group having 20 or less carbon atoms; and $Z^4$ to $Z^5$ represent a counter ion necessary for neutralizing electric charges.

5. The image recording material according to claim 2, wherein the infrared absorbent is a dye represented by at least one of the following general formulae (5) and (6):

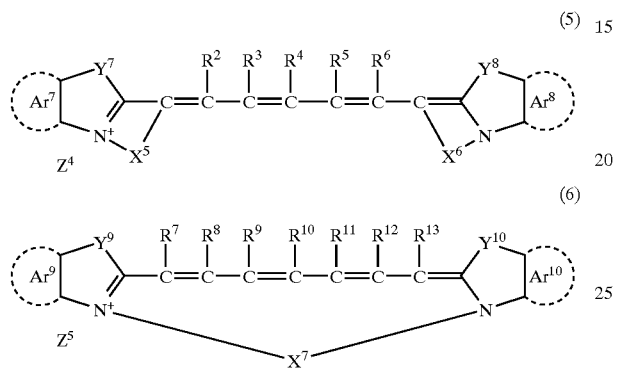

wherein $R^2$ to $R^{13}$ each independently represent a hydrogen atom or a substituent selected from the group consisting of alkoxy groups, aryloxy groups, alkylthio groups, arylthio groups, dialkylamino groups, diarylamino groups, halogen atoms, alkyl groups, aryl groups, oxy groups and the substituent represented by the following general formula (4):

in which $R^{14}$ and $R^{15}$ each represent the same substituent as defined for $R^2$ to $R^{13}$, and $Y^3$ represents an oxygen atom or a sulfur atom; $Ar^7$ to $Ar^{10}$ each independently represent an optionally substituted aromatic hydrocarbon group or an optionally substituted heterocyclic group; $Y^7$ to $Y^{10}$ may be the same or different, each represent a sulfur atom, an oxygen atom, a selenium atom, a dialkylmethylene group having 12 or less carbon atoms, a —CH=CH— group or an —$NR^{16}$— group in which $R^{16}$ represents an optionally substituted hydrocarbon group having 20 or less carbon atoms; and $Z^4$ to $Z^5$ represent a counter ion necessary for neutralizing electric charges.

6. The image recording material according to claim 4, wherein $R^4$ and $R^{10}$ in the general formulae (5) and (6) is a substituent selected from the group consisting of aryloxy groups, arylthio groups and diarylamino groups.

7. The image recording material according to claim 1, wherein the content of the infrared absorbent is 0.01 to 50% by weight based on the total solid content of the image recording material.

8. A heat mode-usable negative-type image recording material onto which images can be recorded with an infrared ray, the material comprising an infrared absorbent, a radical-generating agent and a radically polymerizable compound, wherein said infrared absorbent is a cyanine dye in which at least one substituent on a nitrogen atom in a heterocyclic ring at each end forms a cyclic ring which includes a methine chain.

9. The image recording material according to claim 8, wherein the infrared absorbent is a dye represented by at least one of the following general formulae:

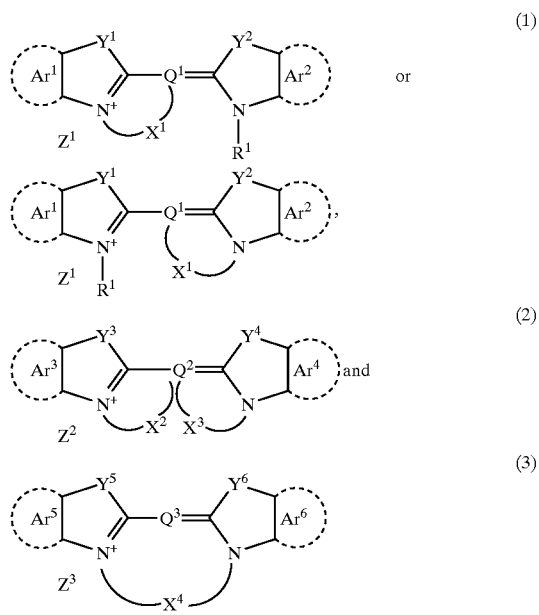

wherein $R^1$ represents an optionally substituted hydrocarbon group having 20 or less carbon atoms; $Ar^1$ to $Ar^6$ each independently represent an optionally substituted aromatic hydrocarbon group or an optionally substituted heterocyclic group; $Y^1$ to $Y^6$ may be the same or different, each represent a sulfur atom, an oxygen atom, a selenium atom, a dialkylmethylene group having 12 or less carbon atoms, a —CH=CH— group or an —$NR^2$— group in which $R^2$ represents the same substituent as defined for $R^1$; $Q^1$ to $Q^3$ represent a pentamethine group or a heptamethine group; $Z^1$ to $Z^3$ represent a counter ion necessary for neutralizing electric charges; and $X^1$ to $X^4$ each independently represent a divalent organic group necessary for forming a cyclic ring.

10. The image recording material according to claim 9, wherein the infrared absorbent is a heptamethinecyanine dye having at least one of an indolenine skeleton and a benzindolenine skeleton.

11. The image recording material according to claim 8, further comprising a dye exhibiting high light absorption in the visible wavelength region.

12. The image recording material according to claim 8, wherein the radical-generating agent is at least one onium salt selected from the group consisting of diazonium salts, iodonium salts, sulfonium salts, ammonium salts and pyridinium salts.

13. The image recording material according to claim 12, wherein the onium salt is an onium salt represented by at least one of the following formulae (III), (IV) and (V):

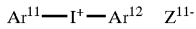  General formula (III)

  General formula (IV)

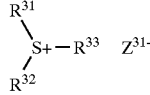  General formula (V)

Wherein $Ar^{11}$, $Ar^{12}$ and $Ar^{21}$ each independently represent an optionally substituted aryl group having 20 or less carbon atoms; $Z^{11-}$, $Z^{21-}$ and $Z^{31-}$ represent a counter ion selected from the group consisting of a halogen ion, a perchlorate ion, a tetrafluoroborate ion, a hexafluorophosphate ion, a carboxylate ion and a sulfonate ion; and $R^{31}$, $R^{32}$ and $R^{33}$ may be the same or different, each represent an optionally substituted hydrocarbon group having 20 or less carbon atoms.

14. The image recording material according to claim 8, wherein the radical-generating agent has a maximum absorption at a wavelength of 400 nm or less.

15. The image recording material according to claim 8, wherein the radically polymerizable compound is a radically polymerizable compound having at least one ethylenically unsaturated double bond.

16. The image recording material according to claim 8, wherein the content of the infrared absorbent is 0.01 to 50% by weight based on the total solid content of the image recording material.

17. The image recording material according to claim 8, wherein the content of the radical-generating agent is 0.1 to 50% by weight based on the total solid content of the image recording material.

18. The image recording material according to claim 8, further comprising a binder polymer.

19. The image recording material according to claim 18, wherein the binder polymer is an alkali-soluble resin having a double bond in a side chain.

20. The image recording material according to claim 18, wherein the binder polymer is an urethane-based binder polymer containing an acid group.

* * * * *